United States Patent
Quenzer et al.

(10) Patent No.: US 10,752,500 B2
(45) Date of Patent: Aug. 25, 2020

(54) METHOD FOR PRODUCING OPTICAL COMPONENTS USING FUNCTIONAL ELEMENTS

(71) Applicant: FRAUNHOFFER-GESELLSCHAFT ZUR FOERDERUNG DER ANGEWANDTEN FORSCHUNG E.V., Munich (DE)

(72) Inventors: Hans Joachim Quenzer, Itzehoe (DE); Vanessa Stenchly, Meldorf (DE)

(73) Assignee: FRAUNHOFER-GESELLSCAFT ZUR FÖRDERUNG ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 16/087,970

(22) PCT Filed: Mar. 21, 2017

(86) PCT No.: PCT/EP2017/056627
§ 371 (c)(1),
(2) Date: Sep. 24, 2018

(87) PCT Pub. No.: WO2017/162628
PCT Pub. Date: Sep. 28, 2017

(65) Prior Publication Data
US 2019/0135619 A1 May 9, 2019

(30) Foreign Application Priority Data
Mar. 23, 2016 (DE) .................. 10 2016 105 440

(51) Int. Cl.
G02B 26/08 (2006.01)
B81C 1/00 (2006.01)
G02B 7/00 (2006.01)

(52) U.S. Cl.
CPC ...... *B81C 1/00317* (2013.01); *B81C 1/00595* (2013.01); *B81C 1/00634* (2013.01);
(Continued)

(58) Field of Classification Search
CPC ............ B81C 1/00317; B81C 1/00595; B81C 2203/033; B81C 2203/031;
(Continued)

(56) References Cited

U.S. PATENT DOCUMENTS

| 5,119,240 A | 6/1992 | Marion et al. |
| 8,550,639 B2 | 10/2013 | Pinter |

(Continued)

FOREIGN PATENT DOCUMENTS

| DE | 102010062118 A1 | 5/2012 |
| EP | 02458677 | 4/1987 |
| JP | 2002299647 A | 10/2002 |

*Primary Examiner* — Selim U Ahmed
(74) *Attorney, Agent, or Firm* — Jacobson Holman, PLLC.

(57) ABSTRACT

The invention relates to a method for producing optical components, wherein a first contact surface is formed by bringing a deformation element into contact with a carrier; and a second contact surface is formed by applying a functional element to the deformation element; said second contact surface at least partially overlapping the first contact surface, so that a deformation zone is formed by the area of the deformation element that lies between the overlapping areas of the two contact surfaces, wherein at least one portion of the deformation zone is heated and deformed in such a way that the functional element is deflected, in particular, shifts and/or tilts, and the functional element is joined with the deformation element during the process step of applying the functional element to the deformation element and/or during the process step of heating and deforming the deformation zone.

23 Claims, 21 Drawing Sheets

(52) U.S. Cl.
CPC ......... *G02B 7/003* (2013.01); *G02B 26/0833* (2013.01); *B81B 2201/042* (2013.01); *B81B 2203/0384* (2013.01); *B81C 2203/0127* (2013.01); *B81C 2203/031* (2013.01); *B81C 2203/033* (2013.01)

(58) Field of Classification Search
CPC ........ B81C 2203/0127; B81C 1/00634; G02B 26/0833; G02B 7/003; B81B 2203/0384; B81B 2201/042
See application file for complete search history.

(56) References Cited

U.S. PATENT DOCUMENTS

| | | |
|---|---|---|
| 2001/0022382 A1 | 9/2001 | Shook |
| 2015/0040368 A1* | 2/2015 | Quenzer ............. B81C 1/00793 29/428 |

\* cited by examiner

METHOD FOR PRODUCING OPTICAL COMPONENTS USING FUNCTIONAL ELEMENTS

TECHNICAL FIELD

The invention relates to a method for producing optical components, in particular, covers for encapsulating microsystems, which have to fulfill, in particular, an optical function.

A cover for encapsulating microsystems (for example, MOEMS, MEMS), which are typically arranged on a carrier substrate, is typically supposed to offer at least protection against contaminants and at the same time is not supposed to have an adverse effect on the mechanical and/or optical functionality of the microsystems. If the functionality of the microsystems is not to be limited to just movements in or, more specifically, parallel to the carrier substrate plane, but is also to provide movements perpendicular to the carrier substrate plane, then a cover must ensure freedom of movement typically corresponding to the microsystems. This requires structuring methods that ensure, for example, a high surface quality of the optically functional areas.

PRIOR ART

If the microsystems are to perform an optical function or if specific parameters or physical variables of the microsystems are to be optically measured, for example, determining the deflection by means of an interferometer or by analysis of video sequences, then an optically transparent cover is typically required. (FIG. 1a)

The document WO 2004/1068665 describes a wafer level packaging method for MOEMS that provides a cover made of glass. However, the carrier wafer with the MOEMS is separated before the encapsulation process. The resulting separate, unencapsulated chips (DIEs) are placed on a new substrate, mounted, contacted, and only then encapsulated. Depressions in the cover can be produced with the prior art embossing and etching processes and/or through the use of spacers, for example, made of silicon.

The document U.S. Pat. No. 6,146,917 describes a wafer level packaging method for MEMS/MOEMS, in which a cover wafer, which is provided with depressions and which is made of silicon or glass, is joined with the carrier wafer by fusion bonding or anodic bonding, resulting in a hermetically sealed housing. The production of the necessary depressions of 50 to 150 μm depth in the cover wafer made of silicon can be carried out by wet chemical etching using a KOH solution.

The document US 2005/0184304 presents a wafer level packaging method for encapsulating micromirror arrays produced by surface micro-machining. A cover wafer made of glass has depressions, which are used as optical windows and can also have finishing layers. The depressions in the cover wafer can have depths of greater than 100 μm and are produced by common shaping methods, for example, etching, casting, or embossing, or through the use of spacers.

All of the documents listed above share the feature that the optical windows of the cover are designed such that they extend parallel to the substrate plane of the carrier substrate (carrier substrate plane), in particular, the carrier wafer, and, therefore, to the MEMS/MOEMS arranged thereon. Furthermore, covers having depressions, which are bounded by optical windows designed so as to be tilted relative to the carrier substrate plane, are described in the prior art.

As described in WO 2007/069165 and U.S. Pat. No. 7,948,667, a blanking out of reflections (FIG. 1b) can be achieved by means of inclined optical windows.

According to US 2007/0024549 A1, it is also possible to manufacture covers with inclined optical windows that allow an encapsulation on the wafer level. The shaping of the cover or, more specifically, the implementation of the necessary depressions is carried out with embossing and shaping methods known from the prior art.

Such shaping methods include, for example, glass deep drawing and blank pressing. In particular, blank pressing is also used to produce optical components, such as, for example, lenses; (see Bernd Bresseler, "Mikroproduktion—Der Werkzeugbau als Maß der Dinge" [Microproduction—Toolmaking as a Measure of Things] on the website http://www.aixtooling.de/index.html?content=/deutsch/aktuelles/aktuelles.html and John Deegan Rochester, Precision Optics "Precision Glass Molding Technical Brief" on the website http://www.rpoptics.com/Precision%20Glass%20Molding%20Technical%20Brief_2.pdf).

Optical components, which have flat or, more specifically, plane parallel surfaces, for example, mirrors or, more specifically, partially transmissive mirrors and beam splitters (documents Chuan Pu, Zuhua Zhu and Yu-Hwa Lo, "Surface Micromachined Integrated Optic Polarization Beam Splitter"; IEEE PHOTONICS TECHNOLOGY LETTERS, Vol. 10, No. 7, July 1998 and Lih Y. Lin and Evan L. Goldstein, "Micro-Electro-Mechanical Systems (MEMS) for WDM Optical-Crossconnect Networks", IEEE 1999) are typically produced from silicon in microsystem technology. Thus, for example, inclined mirrors may be achieved by anisotropic wet chemical etching processes, for example, using KOH (document Jenq-Yang Chang, Chih-Ming Wang, Chien-Chieh Lee, Hsi-Fu Shih and Mount-Learn Wu, "Realization of Free-Space Optical Pickup Head With Stacked Si-Based Phase Elements"; IEEE PHOTONICS TECHNOLOGY LETTERS).

In the document Kyounggsik Yu, Daesung Lee, Uma Krishnamoorthy, Namkyoo Park and Olav Solgaard, "Micromachined Fourier transform spectrometer on silicon optical bench platform"; Sensors and Actuators A130-131 (2006) 523-530, microoptical beam splitters and inclined mirrors are also produced by means of various etching methods, where in this case reference is made to a high quality, in particular, low roughness, of the optically functional surfaces. Surfaces having a root mean square surface roughness of less than 20 nm may be achieved in silicon by means of wet chemical KOH etching. However, such surfaces can only be implemented in standard silicon wafers having specific angles of inclination that are predetermined by the crystal structure of silicon.

The production of optical components based on glass, for example, borosilicate glass, by means of etching methods typically results in surfaces, the roughness of which is not satisfactory for optical applications (see documents Xinghua Li, Takashi Abe, Masayoshi Esashi, "Deep reactive ion etching of Pyrex glass using $SF_6$ plasma", Sensors and Actuators A87, 2001, pp. 139-145, and Ciprian Iliescu, Kwong Luck Tan, Francis E. H. Tay, Jianmin Miao, "Deep Wet and Dry Etching of Pyrex Glass: A Review").

In addition, a method for producing optical components, in particular, covers with inclined optical windows, is described in DE102008012384 and WO 2013/079131. Through the use of reinforcing elements and by means of glass flow, the areas functioning as optical windows may be inclined in a protected and stabilized manner, so that high quality inclined and/or shifted optical windows can be achieved. One disadvantage of the method is that the structuring of the glass substrate is associated with a relatively high cost of materials, since various areas of the glass substrate have to be provided for the absorption of forces, the deformation and the optical windows.

DESCRIPTION

Therefore, the object of the present invention is to overcome the disadvantages of the prior art and to provide a cost effective and more flexible method for producing optical components, in particular, covers, with shifted and/or inclined areas and high surface quality.

According to the present invention, the object is achieved by means of a method, as claimed in claim 1, for producing optical components, in particular, a cover. The dependent claims teach advantageous further developments.

The inventive method, as claimed in claim 1, is used to produce optical components, in which one or more areas or, more specifically, faces, in particular, surfaces, which have to fulfill an optical function, are designed so as to be inclined and/or shifted in relation to a reference area or, more specifically, a reference face of the optical component that is produced or a component, which is used for the application, for which the optical component is provided, wherein the reference area or, more specifically, the reference face also has to fulfill, in particular, an optical function. In particular, the method of the invention has to be useable on the wafer level, so that a plurality of optical components can be produced in parallel.

The optical component has, in particular, at least one optical element, such as, for example, an optical window, a mirror or, more specifically, a partially transmissive mirror, a beam splitter, a prism, a lens and/or an interference filter; or the optical component consists of at least one optical element.

The surfaces of an optical window, through which the radiation used in the application enters the optical window and/or is decoupled again, represent the transmission surfaces of an optical window.

The method of the invention can be used, for example, for producing a cover with one or more optical windows for encapsulating microsystems, which have to fulfill, in particular, an optical function and are usually applied to or arranged on a carrier substrate. Frequently the carrier substrate that is used is a silicon wafer, on which the microsystems (for example, MEMS, MOEMS) to be encapsulated are generated by surface micro-mechanical or volume micro-mechanical processes.

The inventive method, as claimed in claim 1, for producing one or more optical components, in particular, microoptical components, comprises the following process steps:
preparation of a deformation element and a carrier,
bringing the deformation element into contact with the carrier, as a result of which a first contact surface is formed between the deformation element and the carrier,
applying a functional element on the deformation element in such a way that a second contact surface is formed between the functional element and the deformation element, said second contact surface overlapping at least partially the first contact surface, so that a deformation zone is formed by means of the area of the deformation element that is formed between the overlapping areas of the two contact surfaces,
heating and deforming at least one portion of the deformation zone in such a way that the functional element is at least partially deflected, in particular, shifts and/or tilts,
joining the functional element with the deformation element during the process step of applying the functional element to the deformation element and/or during the process step of heating and deforming the deformation zone.

The deformation element is a central element for producing the optical component. By deforming the deformation element or, more specifically, the deformation zone, it is possible to change the orientation or, more specifically, the position of the functional element in comparison to its initial position or, more specifically, in relation to the carrier without the functional element being subjected to a deformation. As a result, it is possible, for example, to obtain a high optical quality of the functional element. The deflection of the functional element is at least partially due to the deformation of the deformation element or, more specifically, the deformation zone and not just by a change in the position of the entire deformation element and/or the carrier.

In addition, the initial shape of said deformation element can be selectively modified by the deformation of said deformation element and can be brought into a desired final shape.

The deformation element is, in particular, a substrate, as a result of which a plurality of optical components can be produced in parallel, or the deformation element is a structural element, as a result of which deformation elements, exhibiting special geometries, for example, in the form of a frame (frame-shaped structure), can be provided.

A plurality of optical components should be transmissive to the electromagnetic radiation used in the application, at least in areas, typically in their entirety. In the case of most optical applications, the highest possible level of transparency of these areas, which are transmissive to the electromagnetic radiation used in the application, is required, so that, for example, a laser beam reaches the microsystem as unaffected as possible.

Correspondingly, the deformation element contains glass and/or a glass-like material or the deformation element is made of glass and/or a glass-like material preferably in at least one area. Glass-like materials are defined in the context of the present invention as substances that are similar to glasses as a result of their thermodynamic properties (amorphous structure, glass transition temperature), although their chemical composition differs from those of the silicate glasses. Examples that can be mentioned here include the artificial glasses, known in chemistry, or organic vitroids, such as polymethyl methacrylate (PMMA), polycarbonate, and polystyrene.

Suitable glasses are, for example, silicate glasses, in particular, borosilicate glasses, since borosilicate glasses are very stable to chemicals and high temperature. The temperature stability and insensitivity of the borosilicate glasses to sudden temperature variations are a consequence of their low coefficient of thermal expansion. In addition, the transmittance is very high at over 90%, in particular, in the wavelength range visible to humans.

In addition to one or more deformation elements, at least one carrier is provided. Said carrier protects the deformation element at least in certain areas and ensures a stable absorption of the forces, in particular, also during heating and deforming.

The carrier is, in particular, a substrate, preferably a silicon wafer, or another two-dimensional support (for example, a tool or a table top), which can receive one or more deformation elements and, thus, enables an optimized serial and/or parallel processing, as a result of which the efficiency of the manufacturing process can be increased.

The carrier contains preferably a semiconductive material, or the carrier is made of a semiconductive material, in particular, silicon, in at least one area. Thus, semiconductor wafers, for example, silicon wafers, can be used as the carrier, so that the proven and easily controllable processes of semiconductor technology, in particular, silicon technology, can be used.

The carrier (in particular, one or more area(s) of the carrier that is/are brought into contact with the deformation element) has, in particular, a non-stick glaze, which contains, in particular, a silicate and aluminum hydroxide, and/or the carrier is coated with or, more specifically, contains, in particular, high temperature resistant materials, in particular, graphite, titanium aluminum nitride, boron nitride, silicon carbide, a precious metal, in particular, platinum, and/or a precious metal alloy, in particular, a platinum indium alloy or a platinum iridium alloy or the carrier or, more specifically, the area is made thereof. Due to a low tendency to join with the deformation element, in particular, glass, and a consequently low wear, such carriers can be used repeatedly or, more specifically, over a longer period of time (longer service life).

In a further embodiment the carrier has a supporting structure that restricts at least one area of the functional element and/or at least one area of the deformation element in its deflectability and/or deformability such that a tilting of the functional element is supported or, more specifically, achieved. As a result, it is possible to ensure a targeted or, more specifically, a differentiated absorption of the forces; and, thus, the process can be optimized, in particular with respect to the amount of time required for production and with respect to the reproducibility of the optical component. In particular, when the supporting structure makes contact with the functional element, the forces, acting on the functional element, can be absorbed directly by the supporting structure or, more specifically, the carrier, and in this way the areas of the deformation zone are selectively relieved.

In another process step the deformation element is brought into contact with the carrier, so that at least a first contact surface is formed between the deformation element and the carrier.

Furthermore, the functional element is applied to the deformation element in such a way that at least a second contact surface is formed between the functional element and the deformation element, said second contact surface at least partially overlapping the first contact surface, so that at least one deformation zone is formed by the area of the deformation element that is formed between the overlapping areas of the two contact surfaces.

With respect to the chronology of these two process steps it is possible to bring the deformation element into contact with the carrier before the functional element is applied or after the functional element has been applied to the deformation element. As an alternative, a simultaneous processing can take place.

The functional element is a further base element for producing the optical component, so that, as a result, the functional element can be an integral element of the optical component that has been produced and, in particular, may have an optical functionality.

Furthermore, the functional element can protect the deformation element or, more specifically, one or more surface areas of the deformation element against excessive mechanical stress or, more specifically, against direct contact with the shaping apparatus when shaping apparatuses (for example, punches) are used and/or can transmit or, more specifically, can distribute, for example, based on a pressure differential, an externally introduced force, to/over the deformation zone.

In addition, the functional element can be used as a molding element, wherein one or more surface areas of the functional element are molded onto the deformation element or, more specifically, onto one or more surface areas of the deformation element. Thus, for example, structures or, more specifically, properties of a surface area of the functional element, such as, for example, roughness and/or planarity, can be transferred to the deformation element.

The functional element is, in particular, an optical element, for example, an optical window, a mirror, a partially transmissive mirror, a beam splitter, a prism, a lens and/or an interference filter. Such an optical element can be produced, for example, separately before the process and then integrated into the optical component to be produced in accordance with the method. The separation between production and integration of the optical element makes it possible to optimize both processes at least partially independently of one another and makes possible a high quality of the optical component, in particular, by maintaining the optical quality of the optical element.

In order to ensure a high quality of the optical component, in particular, the surfaces, at least one area of the surface of the functional element, in particular, an area that acts as a transmission surface and/or is to be brought into contact with the deformation element, has, in particular, a root mean square surface roughness of less than or equal to 25 nm, preferably less than or equal to 15 nm, more preferably less than or equal to 5 nm and/or, in particular, a deviation from planarity per measured length (relative deviation from planarity) of less than or equal to 180 nm/mm, preferably less than or equal to 100 nm/mm. This aspect can be achieved, for example, by polishing the region.

Preferably the functional element is an optical window with at least two transmission surfaces, where in this case the transmission surfaces are designed such that they are flat (planar) and/or parallel to one another.

In order to meet optical quality demands, the transmission surfaces have preferably a relative deviation from planarity of less than or equal to one-fourth of the wavelength of the electromagnetic radiation per millimeter that is used in the application, wherein special preference is given to the use of wavelengths from the ultraviolet up into the infrared wavelength range (for example, between approximately 200 nm and approximately 15 μm). In order to cover a wide range of applications, the transmission surfaces have preferably a relative deviation from planarity of less than or equal to 180 nm/mm, more preferably less than or equal to 100 nm/mm.

In addition, the transmission surfaces have preferably a deviation from plane parallelism per measured length (relative deviation from plane parallelism) of less than or equal to 10 μm/mm. With such surface properties, the functional element, in particular, the optical window offers the best conditions for an optical component (for example, a cover), which causes smaller deviations and less beam widening of the optical beam path, an aspect that results in less corruption of the optical signals.

The values for the deviation from planarity and the deviation from plane-parallelism and also for the root mean square surface roughness were determined by means of an interferometric measuring method. For the measurements, the white light and phase interferometer MicroMap 512 from the company Atos or VEECO Wyko NT 1100 from the company Veeco was used.

Furthermore, the functional element should have preferably a homogeneous material structure, in order to avoid undesired refractions and/or deflections of the radiation.

A plurality of optical components should be transmissive to the electromagnetic radiation used in the application in at least one area, in particular, in their entirety. Correspondingly, the functional element contains glass and/or a glass-like material or the functional element is made of glass and/or a glass-like material, in particular, in at least one area.

Suitable glasses are, in particular, silicate glasses (for example, borosilicate glass) with and without alkaline earth metal additives, such as, for example, Eagle XG® (Corning), Hoya SD 2® (Hoya) and AF 32 ® (Schott), since these glasses are very stable to chemicals and to high temperatures. The temperature stability and insensitivity of these glasses to sudden temperature variations are a consequence of their low coefficient of thermal expansion. In addition, the transmittance is very high at over 90%, in particular, in the wavelength range visible to humans.

In an additional embodiment the functional element contains a semiconductive material, in particular, silicon, or the functional element is made thereof in at least one area, so that the proven and easily controllable processes of the semiconductor technology, in particular, silicon technology, can be used. In addition, in particular, silicon has a transmittance of over 90% for infrared radiation with a suitable anti-reflection coating.

Particularly suitable materials for the functional element have a coefficient of thermal expansion that comes as close as possible to the coefficient of thermal expansion of the material of the deformation element or, more specifically, is as identical as possible thereto. Preferably the difference between the coefficient of thermal expansion of the material of the deformation element and the coefficient of thermal expansion of the material of the functional element should be less than or equal to 5 ppm/deg. K, more preferably less than or equal to 1 ppm/deg. K. As a result, it is possible to reduce the mechanical stresses, which may be generated during cooling due to the different degrees of contraction of the material of the deformation element or, more specifically, the material of the deformation zone and the material of the functional element, and which could lead to damage to the deformation element and/or the functional element or, more specifically, the optical component.

When the deformation element is brought into contact with the carrier and/or when the functional element is applied to the deformation element, the deformation element and the carrier or, more specifically, the functional element and the deformation element are preferably joined together, in particular, preferably in a form fitting and/or integrally joined manner, in particular, by gluing, soldering, or bonding, in order to ensure a high positional stability of the deformation element in relation to the carrier and/or the functional element in relation to the deformation element.

In a preferred embodiment, a form fitting connection between the functional element and the deformation element is implemented by arranging the functional element in an alignment depression of the deformation element, said alignment depression being designed for receiving the functional element. In an equivalent manner, a form fitting connection can be produced between the deformation element and the carrier by arranging the deformation element in an alignment depression of the carrier that has been designed for this purpose. In this type of arrangement, no additional joining substances (for example, adhesive) or special joining steps (for example, bonding) are required that could have an adverse effect on the surface quality, in particular, the functional element and/or the deformation element.

In an additional embodiment, bringing the deformation element into contact with the carrier and/or applying the functional element to the deformation element is/are carried out by anodic bonding, direct bonding, fusion bonding, plasma-activated bonding and/or thermal bonding. Especially in the semiconductor industry, these bonding methods are frequently-used joining techniques that lead to stable connections. Such a joining step takes place, in particular, in a vacuum, as a result of which, for example, air pockets and/or trapped particles in the joining areas, in particular, at the interface between the deformation element and the carrier and/or the deformation element and the functional element and the resulting defects, in particular, in the interface areas of the functional element and/or the deformation element can be reduced.

When the functional element is applied to the deformation element, the functional element is preferably detached from a functional substrate or, more specifically, separated from a functional substrate and, in particular, subsequently brought into contact with the deformation element or, more specifically, is arranged on this deformation element and, in particular, joined with said deformation element.

The functional substrate is designed, in particular, as a plate or a wafer, for example, as a silicon wafer or a glass wafer. As a result, a plurality of functional elements may be produced from one or more functional substrates; and the processing steps, for example, for ensuring the desired strength or, more specifically, thickness of the functional elements may be reduced or, more specifically, optimized.

Preferred detachment methods are drilling, sawing, milling, laser cutting or laser machining, fracturing (possibly with previous scoring), sandblasting and/or etching.

The starting material (functional substrate) for the functional element can be used more effectively as a result of a production process that takes place before the arrangement of the functional element on the deformation element. Hence, the fabrication costs may be reduced in this way and by the associated reduction in the number of additional process steps, such as, for example, lacquer application, exposure, lacquer structuring, lacquer removal.

In addition, the production of the functional elements before the arrangement on the deformation element has the advantage that functional elements made of various materials (for example, several functional substrates) and having different dimensions (for example, thickness) or shapes and also having various properties (for example, with respect to transparency, reflectiveness, or absorption behavior) can be provided for the following arrangement step. This aspect allows an optimized and flexible adaptation of the fabrication to the desired specifications.

Furthermore, during the production of the functional element, before the arrangement on the deformation element, the area of the deformation element, which is not to be brought into contact with or, more specifically, brought into connection with the functional element, is subjected to a lesser extent to aggressive media, such as, for example, etching solutions, so that a high surface quality of this area can be better maintained and retained for later contacting and/or joining steps.

In addition, it is possible to use, in particular, more complex functional elements or, more specifically, functional elements (for example, lenses, prisms) that are made by special manufacturing processes.

The arrangement of the functional element on the deformation element can be performed, for example, with a vacuum handler (vacuum suction unit), a gripper (collet), or a pickup tool (combination of vacuum suction unit and gripper), all of which ensure a positionally accurate and precise arrangement of the deformation element or, more specifically, the functional element.

In a further embodiment, at least one functional element is arranged on a positioning means before the arrangement on the deformation element. The equipping of the positioning means, i.e., the transfer and arrangement of the functional element onto/on the positioning means, can be performed, for example, with a vacuum handler (vacuum suction unit), a gripper (collet), or a pickup tool (combination of vacuum suction unit and collet), all of which ensure a positionally accurate and precise placement on the positioning means.

All means, apparatuses, and tools which stabilize the functional element or, more specifically, hold it aligned in its location, are suitable as positioning means. The handling in relation to the further process steps is made much easier by this stabilization. Thus, for example, the equipping can be performed under clean room conditions at atmospheric air pressure; and a subsequent joining step, for example, the anodic bonding, can be performed in another clean room area in a vacuum.

Suitable positioning means include, for example, adhesive substrates based on magnetic or electrostatic force effect, or substrates which can ensure force locking (for example, the layer that increases the friction), integrally joined (for example, applied adhesive layer), or form fitting connections (for example, depressions or, more specifically, recesses).

In view of a subsequent joining step (for example, anodic bonding), the positioning means is preferably designed such that it is electrically conductive. Correspondingly, the positioning means contains or is made, in particular, of electrically conductive and/or semiconductive materials, such as, for example, silicon.

A receptacle substrate can be used as a suitable positioning means. Such a receptacle substrate has at least one recess or, more specifically, depression (receptacle depression), which is designed to accommodate one or more functional elements and, in particular, holds it in a laterally fixed or, more specifically, aligned manner. Since in this case the alignment is primarily ensured by a form fitting connection between receptacle substrate and functional element, the receptacle substrate can be removed after the arrangement of the functional element on the deformation element by terminating the form fit in a simple manner, in order to release the arrangement, generated in this way, for further processing steps. Then the receptacle substrate may be reused for the next equipping operation and, thus, can be used multiple times, as a result of which there is once again a reduction in the manufacturing complexity and the manufacturing costs.

In addition or as an alternative, the functional element, such as, for example, an optical window can be produced on the deformation element in such a way that at least one functional layer is applied to the deformation element. The functional layer can be produced, for example, by means of deposition methods and/or by using a functional substrate (for example, a silicon wafer or a glass substrate). In this case the functional layer is joined preferably with the deformation element, in particular, in an integrally joined manner (for example, by means of bonding, soldering, gluing or deposition), in order to ensure a high positional stability of the functional layer and the functional element produced therefrom.

It is expedient to apply the functional layer to the deformation element in such a way that a displacement and/or rotation of the functional layer relative to the deformation element is/are reduced or prevented.

Preferably a polysilicon layer is applied as a functional layer to the deformation element, in particular by means of CVD, in particular, hot wire CVD or PECVD, or PVD, in particular, sputtering. Since the process temperatures in these deposition methods are less than 600 deg. C., in particular between 400 deg. C. and 500 deg. C., more temperature-sensitive deformation elements can also be coated with said methods. Furthermore, the functional layer in the form of a functional substrate, for example, a silicon wafer, can be applied to or, more specifically, joined with the deformation element by anodic bonding and/or thermal bonding. Especially in the semiconductor industry these bonding methods are frequently used joining techniques that result in stable connections.

After the functional layer has been applied, it is structured to produce at least one functional element, in particular by means of drilling, sawing, milling, laser cutting, fracturing, sandblasting and/or etching.

The at least one functional element that is produced by detaching from the functional substrate is arranged on the deformation element or, more specifically, joined with said deformation element and/or one or more functional elements are generated by structuring the functional layer in such a way that said functional elements can be deflected by the deformation of the deformation zone that takes place, in particular, at a later time. In addition, in particular, the shape of the second contact surface is formed by the arrangement or, more specifically, joining and/or the structuring; and, thus, the overlapping area is produced.

The previously described embodiments for applying the functional element to the deformation element apply equivalently to the bringing of the deformation element into contact with the carrier. Correspondingly, the deformation element may be produced prior to the bringing into contact (for example, detached from or, more specifically, separated from a deformation substrate) and then arranged on the carrier; and/or the deformation element is produced by applying a deformation layer to the carrier and structuring said deformation layer on the carrier.

The use of both a deformation element and a functional element makes it possible to produce them independently of one another and, thus, to adapt these elements individually to the process flow or, more specifically, the specifications, in particular, for the optical component. As a result, it is possible to achieve, for example, surfaces with a high surface quality—for example, transmission surfaces that are no longer accessible or, more specifically, are difficult to access for processing (for example, a polishing step), for example, after heating and deforming, during the production of the corresponding element (for example, the functional element).

The fact that a first layer, a first area or a first apparatus is arranged "on" or applied "to" a second layer, a second area or a second apparatus can mean here and below that the first layer, the first area or the first apparatus can be arranged or applied immediately in direct mechanical and/or electrical contact on or to the second layer, the second area or the second apparatus. Furthermore, it is also possible to refer to an indirect contact, wherein further layers, areas and/or apparatuses are arranged between the first layer, the first area or the first apparatus and the second layer, the second area or the second apparatus.

In an additional embodiment the functional element, the deformation element and/or the carrier comprise/comprises one or more depressions and/or openings, which are produced, in particular, by means of drilling, sawing, milling, laser cutting, sandblasting and/or etching. According to the invention, a hole is also an opening.

After the carrier has been brought into contact with the deformation element and/or after the functional element has been applied to the deformation element in the area of the depression and/or opening, the depression and/or opening may necessitate a distance between the carrier and the deformation element, between the functional element and the deformation element or, more specifically, between the functional element and the carrier, in order to prevent the surfaces in this area from making contact with one another and, in this way, to preserve the surface quality (for example, in relation to the roughness) of these surface areas, in particular, of the functional element.

In addition, such a contact could also result in the functional element adhering to the deformation element and/or the carrier or, more specifically, in the deformation element adhering to the carrier, and could prevent or render more difficult a deformation-induced deflection of the functional element, in particular, during heating and deforming.

In order to be able to ensure a deformation-induced deflection of the functional element with as few problems as possible, preferably the areas of the functional element that are not relevant for the formation of the overlapping areas should preferably not be in direct or indirect contact (for example, caused by one or more interposed layers) with the deformation element and/or the carrier, in order to prevent the functional element from adhering to the deformation element and/or to the carrier in this area, in particular, before the deformation of the deformation zone.

In order to reduce the adhesive forces in the event of contact, the surfaces or, more specifically, specific surface areas of the functional element, the deformation element and/or the carrier can be provided with various coatings and/or can be prepared by methods for surface modification (for example, nanotexturing). Suitable coating materials are, for example, platinum, platinum alloys (for example, platinum iridium alloy) NiAlN, graphite, and boron nitride.

In addition, the depression and/or opening can be used to set or influence the deformation resistance of the deformation zone. This can be done, for example, in that the depression and/or opening cause/causes the surface of the deformation zone to become larger in size or, more specifically, reduce/reduces the volume of the areas of the deformation element that are adjacent to the deformation zone, with said volume being affected by the deformation.

As a result, the deformation zone in the area of the depression and/or opening is not connected (deformation zone has a surface that defines at least partially the depression and/or opening) or, more specifically, is connected to a lesser extent to a solid, including, in particular, highly viscous liquids, such as, for example, glass. As a result, the forces associated with the structural material displacements that occur during the plastic or, more specifically, viscous deformation of the deformation zone during heating and deforming, cannot be absorbed or can be absorbed to a lesser extent by the vacuum or the material (for example, a gas, a liquid, areas of the deformation element), which is adjacent to the deformation zone. This leads to a decrease in the volume or, more specifically, the surface, over which the deformation force can be distributed, and, thus to a decrease in the deformation resistance.

The term "deformation resistance" is defined in the context of the invention as the resistance with which the deformation zone opposes the force that causes the deformation, i.e., the deformation force (for example, force due to its own weight and/or an externally introduced force). The deformation resistance results from the ratio of the deformation force to the rate of deformation which is caused by said deformation force and is proportional to the viscosity, in particular, the dynamic viscosity, and to the surface, or to an imaginary cut surface through the deformation zone, in which the deformation force acts.

In another embodiment, bringing the carrier into contact with the deformation element and/or applying the functional element to the deformation element can be carried out in such a way that a cavity between the deformation element and the carrier, between the deformation element and the functional element and/or between the functional element, the deformation element and the carrier is formed by the depression and/or opening, where in this case the cavity is, in particular, hermetically sealed.

In addition to ensuring a distance between various surface areas which define the cavity in order to prevent contact or, more specifically, adhesion of the surface areas, in particular, before heating and deforming, and/or in addition to the provision of an at least partially closed volume for the application in which the optical component is used, a pressure below or above the ambient pressure, in particular, the atmospheric air pressure can be generated in the cavity, in particular, before and/or during heating and deforming. By means of such a pressure differential between the pressure in the cavity and the ambient pressure, a force effect can be generated to ensure or, more specifically, to facilitate the deformation process.

In the event that in the process step of heating and deforming the ambient pressure or the process pressure corresponds to the atmospheric air pressure, then, for example, a pressure level between about 15 mbar and about 30 mbar (negative pressure) or between about 1,200 mbar and about 1,600 mbar (overpressure) is set in the cavity.

Through the use of suitable joining techniques, such as, for example, bonding, it is possible to produce, in particular, a cavity that is hermetically sealed from the environment. By carrying out the joining process at a certain pressure, this pressure value can be generated or, more specifically, set in the cavity. Preferably the pressure is between about 10 mbar and about 20 mbar or between about 800 mbar and about 1,000 mbar during the joining process, for example, the anodic bonding, at a temperature of 400 deg. C. Since the subsequent heating process is typically carried out at much higher temperatures than the joining process (the deformation element is brought, for example, to a temperature between about 700 deg. C. and about 900 deg. C. during the process step of heating and deforming), the pressure levels resulting from the specified pressure ranges in the cavity range from about 15 mbar to about 30 mbar or from about 1,200 mbar to about 1,600 mbar.

Since the cavity in this case is hermetically sealed from the environment, the set pressure value is maintained without a further supply of energy, in order to, for example, operate a vacuum pump or a pump over a longer period of time and, thus, in particular, for the deformation or the shaping process.

In particular, as a result of the cavity, which is located between the deformation element and the carrier, and in which a pressure is set that leads to an overpressure or negative pressure in relation to the ambient pressure or the process pressure during heating, it is possible to achieve a force that acts on the deformation element, so that at least one area of the deformation element or the deformation zone is deformed; and as a result, the functional element is deflected. In this case the functional element is subjected to the action of a force only in the area that is in contact with or, more specifically, connected to the deformation zone or the deformation element during the deforming process. Other areas of the functional element, for example, the surface areas defining the cavity between carrier, deformation element and functional element, are not exposed to a force effect causing the deformation of the deformation zone, so that the mechanical load on these areas is reduced; and their shape or their surface quality (for example, planarity and plane parallelism) can be retained particularly well.

Due to the fact that the deformation element is brought into contact with the carrier, the first contact surface or interface is formed between the deformation element and the carrier; and due to the fact that the functional element is applied to the deformation element, the second contact surface or interface is formed between the functional element and the deformation element, wherein the second contact surface overlaps at least partially the first contact surface. The area of the deformation element, which is formed between the overlapping areas of the two contact surfaces, forms the deformation zone.

The overlapping areas of the two contact surfaces (overlapping areas) comprise, in particular, the areas of the first and second contact surfaces, the points of which can be connected to at least one of their images, which are projected onto the respective other contact surface and which, like the points themselves, also belong to the overlapping areas when the following criteria are met, by means of a respective connecting line which extends over the full length through the deformation element or through the deformation element and a solid body that is in contact with said deformation element (for example, inclusions) and accordingly not through a depression, opening or hole or a cavity which comprises, for example, a vacuum, a gas or a liquid. Furthermore, a point and its image, of which the connecting line satisfies the above criteria, will be referred to as a point/image pair hereinafter.

The projection of a point of one contact surface onto the other contact surface is effected, in particular, in such a way that the connecting line between the point and its image on the other contact surface describes the shortest connection or, more specifically, the shortest distance between the point and the image (hereinafter referred to as the "minimum projection") and/or that the point is imaged on the other contact surface by means of an orthogonal projection.

If, in particular, both projections (minimum projection and orthogonal projection) lead to images at one point, or if several images exist and one point requires several point/image pairs, then, in addition to the point, all of its images of the point/image pairs also belong to the overlapping areas. If, for example, two images are to be assigned to one point, then there exist accordingly the point/image pairs point/image 1 and point/image 2; and the point as well as image 1 and image 2 belong to the overlapping areas.

Exceptions are, in particular, the point/image pairs in which the minimum projection of the point produces an image on the edge of the other contact surface. The points and images of such point/image pairs do not belong to the overlapping areas. If, for example, the point/image 1 and the point/image 2 exist again, where the image 2 is a minimum projection of the point onto the edge of the other contact surface, then only the point and image 1 (according to the point/image pair point/image 1) belong to the overlapping areas.

In an additional embodiment, the contact surfaces that include only points of which the minimum projection results in images that are on the edge of the other contact surface do not belong to the overlapping areas, regardless of the result of the orthogonal projection.

The deformation zone extends in the context of the invention, in particular, to the area of the deformation element that is bounded by the overlapping areas and is traversed by the connecting lines of the point/image pairs that belong to the overlapping areas.

According to the embodiments of the prior art, the substrate to be deformed comprises different areas that assume different functions, such as, for example, the functional area, which is to be deflected and which usually has to fulfill an optical function (for example, that of a window) in the context of the application of the optical component; the bearing area, which is supported by a carrier and, thus, allows a relative movement between the bearing area and the functional area of the substrate to be deformed; and the deformation zone, which ensures by its change in shape a deflection of the functional area. Since these areas are arranged laterally adjacent to one another in accordance with the prior art, the substrates, which are to be deformed and which have commensurate lateral dimensions, are necessary.

Owing to the inventive arrangement of the deformation zone between the functional element and the carrier, several, in particular, all, functionalities of said areas can be concentrated or combined in the deformation zone, as a result of which it is possible to significantly reduce the amount of material required and, in so doing, to cut costs, since deformation elements with smaller lateral dimensions are required; or, more specifically, more optical components per lateral expansion of the deformation element can be produced.

In a further embodiment, the first and/or second contact surface or, more specifically, the overlapping areas of the first and/or second contact surface and/or the deformation zone is/are designed in the form of a frame or, more specifically, frame-shaped (for example, a contact surface in the form of an annular ring), in particular, designed to enclose and preferably close around the depression and/or opening in the deformation element or the depression and/or opening. Furthermore, the areas of the deformation element that require such frame-shaped, in particular, closed, overlapping areas can be used as connecting surfaces, for example, to seal, in particular, hermetically, the depression and/or opening enclosed by the frame-shaped deformation zone by means of a connection of the deformation element to one or more encapsulation elements. As a result, it is possible, for example, to encapsulate MEMS or MOEMS with the required freedom of movement.

A further spatial or, more specifically, material optimization which can contribute to reducing the manufacturing costs can be achieved by the fact that the deformation zone, in particular, the frame-shaped deformation zone, defines at least partially the depression and/or opening in the deformation element or, more specifically, the cavity, in particular, between the deformation element and the carrier and/or between the functional element, the deformation element and the carrier. This aspect also leads to the deformation zone having a surface that, as described, has an effect on the deformation resistance.

The magnitude of the deformation resistance of the deformation zone is determined, for example, by the material used, the configuration or, more specifically, the shape and the arrangement of the deformation zone, for example, whether the deformation zone is adjacent to a gas or a solid. Thus, asymmetries of the deformation resistance (resistance asymmetry) can be achieved by means of the geometrical asymmetries of the deformation zone; and in the deformation zone, said asymmetries can cause mechanical stress distributions, which lead to locally different rates of deformation. As a result, a deformation-induced inclination of the functional element can be supported or achieved.

In a preferred embodiment, at least two segments of the frame-shaped deformation zone (frame segments) have deformation resistances of different magnitudes, in particular, during the heating and deforming, so that, in particular, a tilting of the functional element can be facilitated or, more specifically, supported in the process step of heating and deforming.

In an additional embodiment, two or more deformation zones are formed that are in contact with the same functional element or, more specifically, are attributable to the same functional element and are preferably formed diametrically around the depression and/or opening in the deformation element and/or define at least partially the depression and/or opening in the deformation element. The resulting spatial or material optimization can contribute to reducing the manufacturing costs.

Preferably the two deformation zones or, more specifically, in each case a subzone of the two deformation zones (two deformation subzones) have deformation resistances of different magnitude, in particular, during heating and deforming, so that a tilting of the functional element can be facilitated or, more specifically, supported in the heating and deforming step.

The two deformation zones may be areas of the same deformation element and may be separated by at least one area of this deformation element, which does not act as the deformation zone; or the two deformation zones can be assigned to different deformation elements.

The use of multiple deformation zones in conjunction with one functional element, in particular the use of multiple deformation elements, makes possible a flexibilization of the process, since the deformation zones or the deformation elements can be designed individually. Thus, the two deformation zones can have different magnitudes of deformation resistance, for example, by using different materials; and/or the two deformation zones are designed geometrically different, in order to facilitate or, more specifically, support a tilting of the functional element in the process step of heating and deforming (during heating and deforming).

In the context of the invention, the structural or geometrical considerations with respect to the deformation zone relate, in particular, to the shape of the deformation zone prior to the shaping of the deformation element or, more specifically, before the process step of deforming the deformation zone.

The type of deflection of the functional element can be influenced in a targeted manner by means of a specific design of the deformation zone, and, in particular, a tilting of the functional element can be facilitated or, more specifically, supported.

Therefore, in a further embodiment, the frame-shaped deformation zone or the two deformation zones is/are formed in such a way that the surface areas of two cross sectional areas of the frame-shaped deformation zone and/or the surface areas of two cross sectional areas and/or of two overall cross-sectional areas of the two deformation zones are different in size, wherein the cross sectional areas are not to be assigned to the same deformation zone of the two deformation zones.

The term "frame surface" that is used hereinafter refers to the surface of the frame-shaped deformation zone after abstraction by releasing the deformation zone. In this respect the term "release" is defined as the imaginary removal of all elements and areas that do not belong to the frame-shaped deformation zone. Correspondingly, the frame surface is made up of real surfaces (surfaces) and/or surfaces, which result from the abstraction and which are produced by being released from real interfaces (in particular, between the deformation zone and the carrier or the functional element) and/or imaginary interfaces (in particular between the deformation zone and an adjoining area of the deformation element that does not belong to the deformation zones).

A cross-sectional area of the frame-shaped deformation zone comprises, in particular, the set of all points of the frame-shaped deformation zone that is bounded by a flat closed curve, where in this case the curve describes, starting from a point of the frame surface, the shortest connection extending on the frame surface to the point itself (the curve begins and ends accordingly at the same point), so that the curve encloses only those points that belong to the frame-shaped deformation zone, but does not belong to the frame surface. Correspondingly the points of the curve are the only points of the frame surface that are also enclosed by the cross-sectional area.

And/or the cross sectional areas of the frame-shaped deformation zone that are to be compared result, in particular, from a cut of the frame-shaped deformation zone through a cutting plane, which is defined by two orthogonal main axes of inertia and/or the main axes of volume (main axes of inertia in the case of a fictitious homogeneous mass distribution) of the frame-shaped deformation zone, where in this case only the cutting planes are taken into account that, as a result of the cut, bring about two cross-sectional areas and cut the two contact surfaces.

The cross-sectional areas of the two deformation zones that are to be compared result, in particular, from a cut through both deformation zones through a cutting plane, on which both volumetric centers of gravity of the two deformation zones are located and which is oriented in such a way that the two contact surfaces are cut; and the sum of the surface areas of the two cross-sectional areas gives a minimum. Should the cut result in a plurality of cut surfaces for one deformation zone, then their surface areas are added together in order to obtain the surface area of a resulting cross-sectional area that can be used for the comparison.

An overall cross-sectional area is the sum of the cross-sectional areas of the two deformation zones, where in this case the cross-sectional areas are formed by a cut of the two deformation zones through the preceding (above) defined cutting plane or through one of their images generated by parallel displacement of the cutting plane in the direction of their normal vectors.

In particular, an infinitesimal volume element and, thus, a segment of the frame-shaped deformation zone (frame segment) or a subzone of a deformation zone (deformation subzone) is defined by moving the cutting plane or, more specifically, the plane in which the cross sectional area is located, in the directions predetermined by the normal vectors of this plane, by infinitesimal distances of the same length, where in this case, when comparing two volume elements, both volume elements are defined by infinitesimal distances of the same length.

In another embodiment, the deformation zone has a surface wherein, in particular, the two segments of the frame-shaped deformation zone and/or the two deformation zones and/or the two deformation subzones have surface areas of different sizes.

The surface of the deformation zone can be produced or enlarged by structuring the deformation element, in particular, by sawing and/or etching. As a result, the deformation resistance can be influenced or, more specifically, set or, in particular, reduced in size. Thus, the difference in the size of the surface areas of the surfaces of the two segments of the frame-shaped deformation zone and/or the two deformation zones and/or the two deformation subzones can be achieved by saw cuts of different depths into the deformation element.

According to a further embodiment, the structuring of the functional element and the structuring of the deformation element, in particular, for enlarging the surface of the deformation zone are carried out in the same process step, in particular, a sawing step. This aspect can save process steps and simplify the method.

In a further embodiment of the invention, the surface areas of the respective areas of the first and/or second contact surface, both of which define or are adjacent to the two segments of the frame-shaped deformation zone and/or the two deformation zones and/or the two deformation subzones, are different in size, an aspect that may be necessitated by the locally different deformation resistances, in order to achieve or, more specifically, facilitate a tilting of the functional element.

In another embodiment, the outer edge of the first and/or second frame-shaped contact surface, in particular, the frame-shaped overlapping area of the first and/or second contact surface describes a first geometric figure; and the inner edge describes a second geometric figure, wherein the first and the second geometric figures are each selected independently of one another from the group consisting of rectangle, trapezoid, in particular, isosceles or right-angled trapezoid, circle and triangle.

Contact surfaces of different shapes or overlapping areas of the contact surfaces and, thus, deformation zones of varying shapes can be generated by the combination of corresponding geometries for the outer and inner edge, as a result of which locally different deformation resistances can be set.

Thus, in one exemplary embodiment, the outer and inner edges of the frame-shaped overlapping area of the first and/or second contact surfaces are each described by a rectangle, the peripheral centers of which do not coincide; wherein, in particular, an axis of symmetry of the rectangle, describing the inner edge, and an axis of symmetry of the rectangle, describing the outer edge, lie on the same straight line. As a result, two opposite legs of the respective frame-shaped overlapping area have identical surface areas; and the other two opposite legs have different surface areas, so that the deformation zone or, more specifically, its deformation resistance can be set asymmetrically.

In a further embodiment, one area of the deformation element is provided with a stabilization layer which counteracts the deformation of the deformation element or the deformation zone, in particular, locally.

In particular, the stabilization layer is adjacent to the deformation zone or covers at least one portion of the surface of the deformation zone. Preferably the stabilization layer can border on one of the two segments of the frame-shaped deformation zone and/or on one of the two deformation zones or deformation subzones and/or cover at least one portion of the surface of one of the two segments of the frame-shaped deformation zone and/or one of the two deformation zones or deformation subzones.

As a result, areas of the deformation element or, more specifically, the deformation zone can be reinforced or, more specifically, stabilized, in order to counteract a deformation of these areas. In connection with areas of the deformation element that are not provided with a stabilization layer, it is possible, as a result, to facilitate or, more specifically, to support a tilting of the functional element.

During the shaping of the deformation element or during the deformation of the deformation zone in the process step of heating and deforming, in particular, the flow properties of the deformation zone or the material of the deformation zone, as they exist, in particular, close to and above the softening temperature (softening point) or the solidus temperature, are utilized. The advantage of this type of shaping, also referred to, in particular, as glass flow, in relation to other shaping or embossing methods, such as glass deep drawing or glass embossing (for example, blank pressing), is mainly that, in particular, optical components with substrate elongation or wafer elongation, in particular, substrate diameters or wafer diameters of greater than or equal to 80 mm, preferably greater than or equal to 150 mm, more preferably greater than or equal to 300 mm, can be achieved with high surface quality, in particular, low surface roughness, high surface planarity and high plane parallelism of the surfaces of the substrate sides.

In particular, if the starting substrate consists of glass, the surface roughness of the optical components, which are produced, for example, by means of glass deep drawing or glass embossing, is frequently not satisfactory. The substrates which are formed by glass drawing are roughened and cannot meet the requirements of, for example, an optical window.

In the case of blank pressing, the maximum elongations or dimensions of the optical components that can be produced are greatly limited. Furthermore, in the case of this embossing process very high quality, durable and, therefore, expensive embossing tools are necessary, an aspect that restricts flexible manufacturing.

In the process step of heating and deforming, at least one portion of the deformation zone is heated and deformed in such a way that the functional element is deflected at least partially or, more specifically, in certain areas, in particular, shifts, inclines and/or twists (torsion).

If the deformation element or the deformation zone was to be heated, in particular, also in the area of the first and/or second contact surface, then a high-quality surface area of the functional element and/or the carrier with, for example, slight roughness and small deviation from planarity can be molded on the surface of the deformation element through the contact with the deformation element. This aspect has the advantage that the requirements of the surface quality of the provided deformation element in the corresponding area can be lower; and any necessary processing step, such as, for example, polishing, can be dispensed with.

In order to enable such a molding or, in particular, to obtain the shape of the functional element and its surface properties, in particular, the upper cooling temperature or the solidus temperature of the material of the functional element and/or the carrier is greater than the upper cooling temperature or the solidus temperature of the material of the deformation element or the deformation zone, where in this case the temperature difference between the respective upper cooling temperature or solidus temperature of the material of the functional element and/or the carrier and the material of the deformation element or the deformation zone should be as large as possible, in particular, greater than or equal to 100K. If the functional element and/or the carrier is/are made, for example, of silicon; and the deformation zone is made of borosilicate glass, then the solidus temperature or melting temperature of silicon and the upper cooling temperature of borosilicate glass is/are the determining factors for forming the difference.

In one advantageous embodiment the softening temperature or liquidus temperature of the material of the deformation element or the deformation zone is below the softening temperature or liquidus temperature, in particular, below the upper cooling temperature or solidus temperature, of the material of the functional element and/or the carrier. As a result, an efficient deformation process can be achieved while at the same time maintaining the shape of the functional element and/or the carrier.

Correspondingly in the process step of heating and deforming, at least one portion of the deformation zone, in particular, the entire deformation zone or the deformation element is brought preferably to a temperature that is above the upper cooling temperature or solidus temperature of the material of the deformation zone or the deformation element and below the upper cooling temperature or solidus temperature of the material of the functional element and/or the carrier.

The temperature interval between solidus and liquidus temperature of a material or a substance is referred to as the melting interval or melting range. In the case of, for example, eutectic alloys and pure metals, the solidus and liquidus temperatures coincide. In these cases, solidus and liquidus temperatures have the same value, which is referred to as the melting point.

In particular, at least one portion of the deformation zone, in particular, the entire deformation zone or the deformation element is brought to a temperature between the softening temperature minus 150 deg. C. and the softening temperature plus 100 deg. C. of the material of the deformation zone or the deformation element in the process step of heating and deforming.

In particular, with regard to the use of glasses or glass-like materials for the deformation zone or the deformation element, the upper cooling temperature and the softening temperature are important properties for assessing the suitability for the deformation process.

Below the upper cooling temperature, the viscosity of; for example, a glass and, thus, its resistance to deformation is/are usually too high to carry out a practicable deformation process. Above the upper cooling temperature, the viscosity decreases, and the deformation properties improve. In the range of the softening temperature, the corresponding material has particularly favorable deformation properties, in particular, with respect to viscosity.

When borosilicate glass with a softening temperature of about 820 deg. C. is used, temperatures, for example, between about 700 deg. C. and about 900 deg. C. are useful in the process step of heating and deforming.

It is possible to determine for each glass a cooling range that is bounded by the upper and lower cooling temperatures. The location of these temperatures is defined by the viscosity, wherein the upper cooling temperature is the temperature, at which the glass has a viscosity of $10^{13}$ or, more specifically, $10^{13.3}$ dPa·s. At the lower cooling temperature, the viscosity is $10^{14.5}$ dPa·s.

The determination method for determining the upper cooling temperature is a direct viscosity determination, which, as a thread drawing method, is related to the Littleton method described below, except that the temperature at which the thread becomes longer under a load of 1,000 g at a rate of 0.136 mm/min., is sought. Then the viscosity is $10^{13}$ or, more specifically, $10^{13.3}$ dPa·s. If the furnace is cooled even further, an extrapolation on the elongation rate of 0.0043 min/min. gives the value for the lower cooling temperature.

The softening temperature or the softening point, also called the Littleton temperature or Littleton point, is determined according to a method of Littleton. In this case a material thread (for example, a glass thread) having a diameter of 0.65 mm to 1.0 mm and a length of 22.9 cm is suspended in a furnace of specific construction. At a heating rate of 5 to 10 K/minute, the lower end of the thread hanging out of the furnace is observed. As the temperature rises, the thread becomes longer under its own weight. The temperature at which the elongation is 1 mm/min., is referred to as the Littleton temperature. Most glasses or glasslike materials have at this temperature a viscosity of approximately $10^{7.6}$ dPa·s (Scholze, Horst "Glas—Natur, Struktur and Eigenschaften" [Glass—Nature, Structure, and Properties], 3rd. edition, Springer Verlag, page 151).

At least one portion of the overlapping area of the first contact surface and at least one portion of the overlapping area of the second contact surface are preferably retained or continue to exist during the heating and deforming, where in this case the overlapping area of the first contact surface and the overlapping area of the second contact surface define, in particular, the same deformation zone. Correspondingly, the contact between the deformation element and the carrier in the overlapping area and the contact between the functional element and the deformation element in the overlapping area are not dissolved at least to some extent during heating and deforming, in order to ensure an effective transmission of force to the deformation zone during heating and deforming and/or in order to mold one or more surface areas of the functional element and/or the carrier onto the deformation element.

It is particularly preferred that the overlapping areas are retained or continue to exist in their entirety during heating and deforming.

The process step of heating and deforming is carried out preferably in a time-controlled manner or until the contact of the deformation element and/or the functional element with a deflection delimitation, which delimits, for example, the maximum desired deformation-related deflection. For example, a tool, a functional element and/or the carrier, in particular, the base surface of the depression in the carrier, can be used as the deflection delimitation. As a result, the accuracy of the deflection can be increased; or, more specifically, the reproducibility of the optical component can be improved.

In the process step of heating and deforming, at least one portion of the deformation zone is deformed by a force (deformation force), where in this case the deformation can extend beyond the deformation zone to areas of the deformation element that do not belong to the deformation zone. Due to the material coupling to the deformation zone, in particular, areas adjacent to the deformation zone can also be deformed by the deformation process, since the deformation force-induced stress profile or velocity profile in the deformation element can extend beyond the deformation zone.

The deformation of the deformation zone can be caused preferably by the force of the intrinsic weight of the functional element and/or the deformation zone or the deformation element and/or by a force introduced from the outside.

An externally introduced force or deformation force can be based expediently on a mechanical, for example, a pneumatic, and/or magnetic and/or electrical and/or piezoelectric interaction.

In an additional embodiment the externally introduced force is effected as described above, by a pressure differential between two, in particular, opposite sides of the functional element and/or by a pressure differential between two, in particular, opposite sides of the deformation element. As in the case of the deformation by the force of the intrinsic weight, also in the case of this method of the force introduction, the deformation element and/or the functional element do/does not have to be brought into contact with another object, for example, an embossing tool, which could reduce the surface quality of the deformation element and/or the functional element. Correspondingly, with this type of force input a high surface quality of the deformation element and/or the functional element is retained or guaranteed.

In addition, the heating and deforming in this case can be carried out until a change in the volume of the cavity, where the change is caused by the deformation of the deformation zone or the deformation element leads to a pressure level in the cavity that corresponds to the ambient pressure.

Especially designed shaping apparatuses are also suitable for introducing a deformation force, where in this case the functional element can assume a protective function, in order to avoid that the shaping apparatus makes contact with the deformation element, in particular, in the process step of heating and deforming. Contact of the shaping apparatus with the deformation element could lead to adhesion, which could lead to defects on the deformation element when the shaping apparatus is detached.

In addition, the functional element can distribute a force, which has been introduced locally by the shaping apparatus, into a two-dimensional force effect over the deformation zone.

In addition to the attack point of the deformation force, properties, such as, for example, the deformation resistance of the deformation zone or the deformation element with respect to the attacking deformation force are decisive as to how the functional element is deflected.

As described above, the functional element, when applied to the deformation element, can be joined with it. In addition or, more specifically, as an alternative, it is possible that the functional element, when applied to the deformation element, is arranged on the deformation element and that the connection between the functional element and the deformation element is produced, in particular, by thermal bonding in the process step of heating and deforming.

In particular, when the connection between the functional element and the deformation element is produced during heating and deforming, it is possible to dispense with an additional process step for joining, where said additional process step could represent an additional, in particular, thermal stress, in particular, for the functional element and could adversely affect the quality, in particular, the optical quality. In addition, a particularly effective molding of the surface area or the surface structure of the functional element on the deformation element can be ensured, in particular, by thermal bonding.

Owing to a connection between the functional element and the deformation element, a high positional stability of the elements, in particular, their contact surfaces, can be mutually ensured; and, thus, a high surface quality of the contact surface(s) is preserved and, as a result, obtained and/or protected and/or generated. Furthermore, an effective transmission of force for deforming the deformation zone or the deformation element can be ensured by the connection.

A stable position of the elements with respect to one another can be ensured by means of a connection, in particular, by an integrally joined connection, of the functional element to the deformation element, even after heating and deforming, so that while maintaining the connection, an optical component can be produced that may comprise both elements and, thus, for example, different materials, or so that the connected elements can be supplied to a separation step, for example, a selective etching step, that is independent of the shaping apparatus or the apparatuses for introducing the deformation force. Owing to such a separation of shaping and separation step, even deformation elements with complex structures—in particular, large topographic contrasts, such as, for example, narrow deep trench structures or surfaces that are designed at right angles to one another—can be separated from the functional element without loss of quality.

In particular, if the at least one functional element has no further functions to fulfill, said functional element is removed or separated from the deformation element at least partially, preferably completely, preferably in a further process step.

Special preference is given to the removal that takes place in such a way that the functional element can be reused and used several times, as a result of which the efficiency of the method can be increased; and the effort involved in manufacturing or the cost of manufacturing can be reduced.

This aspect can be realized, for example, by the fact that the functional element comprises a sacrificial layer in at least the area that is brought into connection with the deformation element; and after the deformation of the deformation element, this sacrificial layer is removed in order to release the functional element. As an alternative, the sacrificial layer can first be applied to the deformation element and structured, where in this case the functional element is then arranged on the sacrificial layer or, more specifically, is connected to the sacrificial layer in a subsequent process step. A preferred sacrificial layer contains or is made of silicon, germanium, zinc oxide, molybdenum, and/or tungsten. For such a functional element, which is connected to the deformation element by means of a sacrificial layer, it is possible to use materials, such as, for example, high melting point or, more specifically, high temperature resistant glasses (for example, Corning Eagle XG®, Corning Lotus Glass®, Schott AF32®), which in the case of a direct connection to the deformation element may only be removed with great effort, provided that the deformation element or the finished component is not to be damaged.

For certain applications, it may be advantageous that one or more portions of the functional element remain on the deformation element or the finished optical component, for example, as a frame-shaped stabilizing structure or aperture structure.

Even the carrier is preferably completely removed after deformation. In some cases, however, the microsystems to be encapsulated are arranged on the carrier, so that a continuation of the connection between the deformation element and the carrier may be practical.

In one advantageous embodiment at least one area of the deformation element and/or the functional element is provided with at least one finishing coating (in particular, with an anti-reflective coating, an anti-static coating, a reflective coating, and/or an absorption coating) and/or functional surface structures, as a result of which the functionality of the optical component can be improved.

Finishing coatings, which are preferably used, are anti-reflective coatings, which further reduce, for example, reflections on a cover, in particular, on its optical windows, and, in so doing, the radiation losses. Such anti-reflective coatings can be implemented, for example, by layer systems made of magnesium fluoride and titanium oxide, or silicon oxide and titanium oxide.

Furthermore, anti-static coatings, which minimize an electrical charging of the optical component, can be used. A material that is suitable for anti-static coatings in optical applications is ITO (indium tin oxide), because it has a high electrical conductivity in doped form and has a high transparency over a broad wavelength range.

Furthermore, it may be advantageous if reflective coatings, for example, metal layers, are applied as the finishing coatings which can form locally reflective areas after structuring, for example, in order to spatially delimit an incident light beam (aperture function) or to form a static deflecting mirror in the vicinity of the optical windows.

Preferably used finishing coatings are, furthermore, absorptive coatings that absorb electromagnetic radiation of specific wavelengths or entire wavelength ranges.

Functional surface structures are in the context of the invention geometric modifications of the surface in the micrometer range and/or nanometer range. As a result, specific surface properties can be influenced in a targeted manner. Thus, through the preferred use of moth-eye structures (see the document D. G. Stavenga, S. Foletti, G. Palasantzas, K. Arikawa "Light on the moth-eye corneal nipple array of butterflies", Proceedings of the Royal Society B (2006) 273, 661-667, doi: 10.1098/rspb.2005.3369, published online on Dec. 6, 2005), the structural dimensions of which are less than the wavelength of the radiation used in the application, it is possible to reduce the index of refraction of a boundary layer (for example, as exists between a glass surface and the air surrounding it), for which reason moth-eye structures are suitable for anti-reflective treatment of surfaces. Such an anti-reflective treatment is advantageous, especially if a coating proves to be unsuitable for reasons of adhesion.

Moth-eye structures can be produced on the surfaces of the deformation element, for example, with the aid of embossing methods after the shaping of the deformation element. However, the embossing of such structures in inclined and/or shifted surfaces is extremely difficult. Moth-eye structures may be produced, in particular, on inclined surfaces by utilizing the flow properties of the deformation element.

Correspondingly in one preferred embodiment moth-eye structures are produced as functional surface structures in such a way that before the arrangement and/or the bringing into contact of the functional element on/with the deformation element, at least the area of the functional element, which is brought into contact with the deformation element, is provided with a negative mold of the moth-eye structures. After the arrangement and/or the bringing into contact of the functional element on/with the deformation element during the shaping of the deformation element, the moth-eye structures are generated on the contact surface of the deformation element by molding the negative mold in the functional element on the contact surface of the deformation element, in particular, on the transmission surfaces (for example, of a prism). In this case, the material of the deformation element flows into the cavities predefined by the negative mold in the functional element, with the result that the corresponding surface geometry is produced. The shaping of the deformation element and the generation of the moth-eye structures can also be carried out at separate times or successively in independent steps.

In a further preferred embodiment the finishing coating is generated in such a way that, before the arrangement and/or the bringing into contact of the functional element on/with the deformation element, at least the area of the functional element, which is brought into contact with the deformation element, is provided with the finishing coating; and subsequently a connection is produced between the deformation element and the functional element by means of a connection between the finishing coating and the deformation element; or that before the arrangement and/or the bringing into contact of the functional element on/with the deformation element, the finishing coating is applied to the deformation element; and subsequently the functional element is arranged on and/or connected to the finishing coating, so that after the deformation step, the functional element is at least partially removed, and the finishing coating remains on the deformation element. With the application of the finishing coating on the deformation element before the deformation of the deformation element, it is possible to achieve a homogeneous finishing coating having small tolerances in the thickness of the individual layers of the finishing coating, in particular, on inclined optical areas, such as, for example, the transmission surface of a prism. When the finishing coating is applied after the deformation of the deformation element, the deposition and possible structuring of the individual layers have to be carried out, for example, on inclined areas or surfaces from which, in particular, if anisotropic deposition methods are used, differences can result in the thicknesses of the individual layers and, therefore, location-dependent differences in the properties or, more specifically, in the optical functionality of the finishing coating and therefore the optical component.

A broadband anti-reflective coating, produced according to this embodiment, could be based, for example, on a layer sequence of silicon oxide and silicon nitride. In this case the silicon oxide layer is applied first to the functional element, for example, made of silicon. Subsequently, the silicon nitride layer is applied to the silicon oxide layer. Thereafter, the layer sequence consisting of functional element, silicon oxide layer, and silicon nitride layer is joined with the deformation element by bringing the silicon nitride layer into connection with the deformation element. After selective removal of the functional element, a layer sequence, consisting of deformation element, silicon nitride layer, and silicon oxide layer and, therefore, a deformation element, provided with an anti-reflective coating, is left. Instead of silicon nitride, titanium dioxide can also be used as an alternative.

Combinations of finishing coating and functional surface structures, for example, a combination of anti-static coating and moth-eye structures, can also produce improvements in the functionality of the optical component.

EXAMPLES

Without loss of generality, the invention is described in greater detail below by means of examples.

Figures 1*a* and 1*b* depict prior art discussed in the PRIOR ART section of this application.

FIGS. 2 to 2*d* show a cover array 22, produced with the method according to the invention, with inclined optical windows 3 and the use for encapsulating micromirrors 25.

Figure 1A:
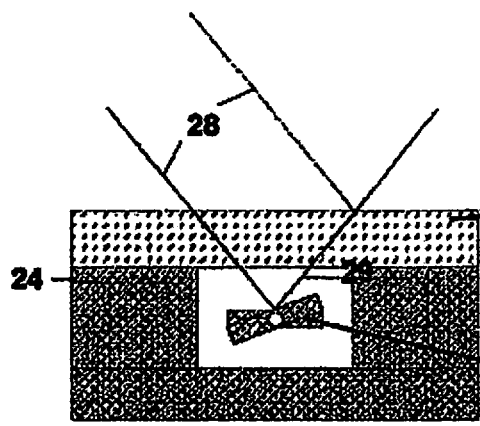
Figure 1B:
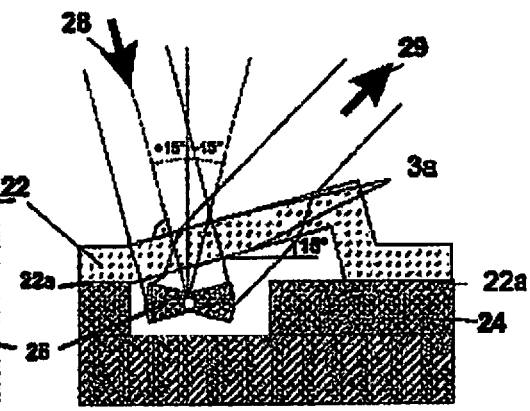

FIGS. 5a to 5g show the sequence of steps of an additional exemplary embodiment for producing a cover array 22 with inclined optical windows 3, according to the method of the invention, using a tool, acting as a carrier 5, or, more specifically, a support 5 with venting channels 23.

FIGS. 6a to 6f and FIGS. 7a to 7e show the sequence of steps of other exemplary embodiments for producing a cover array 22 with inclined optical windows 3, according to the method of the invention, using a shaping apparatus 30 for force introduction.

Figure 8A:
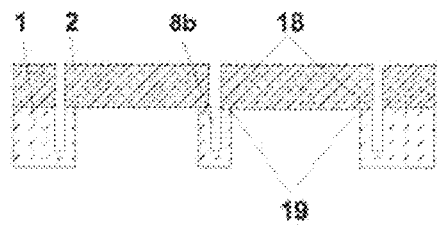
Figure 8B:
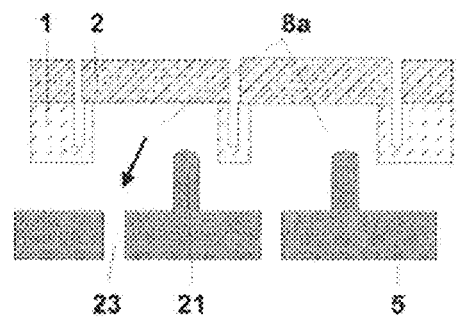
Figure 8C:
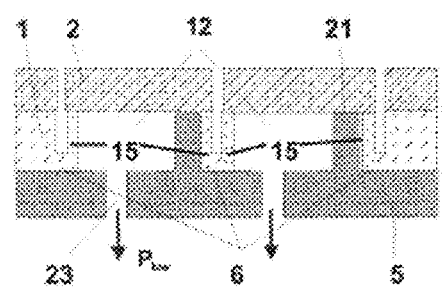
Figure 8D:
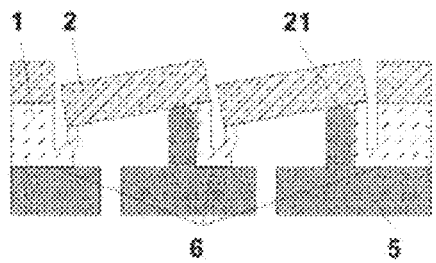
Figure 8E:
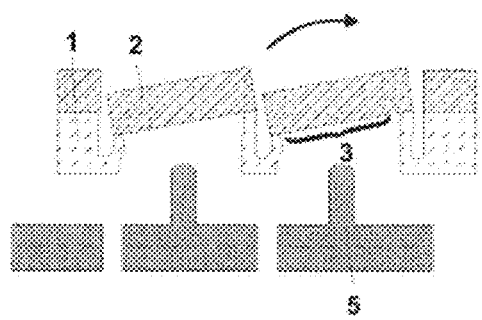

FIGS. 8a to [sic: 8]e show the sequence of steps of an exemplary embodiment for producing a cover array 22 with inclined optical windows 3, according to the method of the invention, using a carrier 5 with supporting structures 21.

FIGS. 9a to 9e show the sequence of steps of a further exemplary embodiment for producing a cover array 22 with inclined optical windows 3, according to the method of the invention, using a stabilization layer 20.

FIGS. 10a to 10i, FIGS. 11a to 11f, FIGS. 12a to 12b and FIGS. 13a to 13f show the sequence of steps of additional exemplary embodiments for producing a cover array 22 with an inclined or, more specifically, inclined and shifted optical windows 3, according to the method of the invention, using one or more cavities 12, 13, in particular, between the carrier 5 and the deformation element 1.

FIGS. 14a to 14d show the sequence of steps of another exemplary embodiment for producing a cover array 22 with inclined and shifted optical windows 3, according to the method of the invention, using depressions 10 in the carrier.

FIGS. 15a to 15d show the sequence of steps of a further exemplary embodiment for producing a cover array 22 with inclined and shifted optical windows 3, according to the method of the invention, using cavities 11 between the deformation element 1 and the functional elements 2.

FIGS. 16a to 16f show the sequence of steps of an exemplary embodiment for producing an array of prisms or inclined mirrors 22b, according to the method of the invention, using a deformation element 1 that is flat on both sides.

FIGS. 17a to 17g show the sequence of steps of an exemplary embodiment for producing an array of prisms or inclined mirrors 22b, according to the method of the invention, using island-shaped deformation elements 1.

FIGS. 18a to 18b and FIGS. 19a to 19b show the sequence of steps of additional exemplary embodiments for producing a cover array 22 with shifted optical windows 3, according to the method of the invention.

Figure 2:
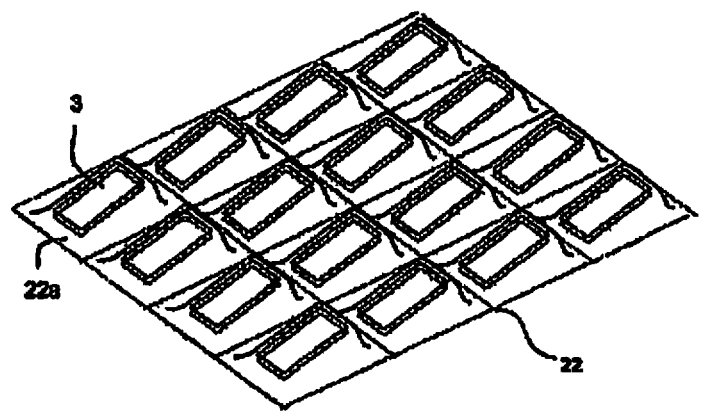

FIG. 2 shows a cover array 22 that is produced with the method according to the invention and that comprises inclined optical windows 3, where in this case a suitable cover array 22 can be used for encapsulating an entire silicon wafer 24.

Figure 2A:
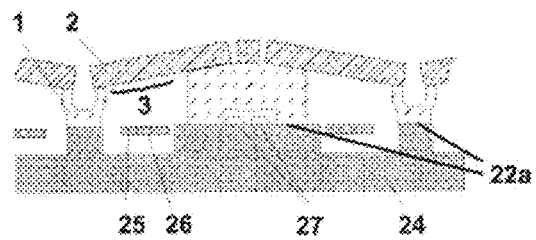
Figure 2B:
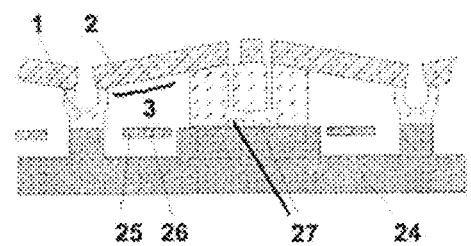
Figure 2C:
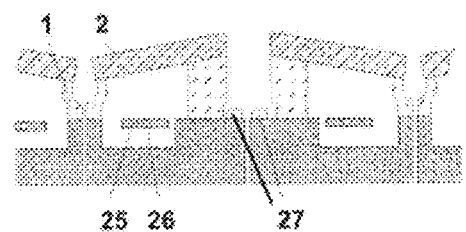
Figure 2D:
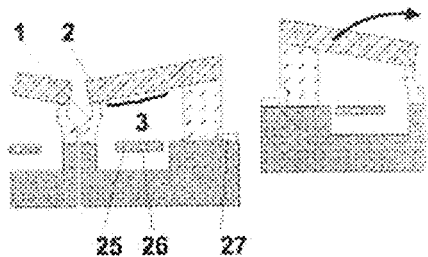

The inclined optical windows 3 are arranged in a two-dimensional array and typically have an inclination of between about 5 deg. and about 20 deg., preferably about 15 deg., with respect to the contacting surface 22a of the cover array 22 that extends around each window 3. The contacting surface 22a, extending around each inclined optical window 3, is closed in the shape of a frame and is designed so as to be flat. Flat surfaces, which are closed in the shape of a frame and dimensioned accordingly, are provided on the carrier substrate or, more specifically, the silicon wafer 24 as the counter-contacting surfaces, as shown in FIG. 2a. This arrangement allows a hermetically sealed connection to the environment.

The inclined optical windows 3 are provided on both sides with an anti-reflective coating consisting of a layer system made of silicon dioxide and titanium oxide.

After the bonding of the cover array 22 on the silicon wafer 24, the contact pads 27, which are arranged on the silicon wafer 24, are exposed; and the chips are separated, as a result of which a micromirror 25, encapsulated with a cover 22, is formed. FIGS. 2a to 2d.

FIGS. 4a to 4m show the sequence of steps of several exemplary embodiments for producing a cover array or, more specifically, a cover 22 with inclined or, more specifically, inclined and shifted optical windows 3, according to the method of the invention. The deformation element 1, which is provided at the beginning of the process, is a glass wafer, which is flat on both sides and has plane parallel substrate planes 1a, 1b; and this glass wafer is made of borosilicate glass and has a thickness of between about 500 μm and about 1,000 μm, in this case 725 μm. Hence, both sides of the wafer or, more specifically, the wafer planes 1a, 1b of the glass wafer 1 are polished and, as a result, have a high surface quality with a root mean square surface roughness of about 1 to 3 nm. In addition, the glass wafer 1 has rectangular (FIG. 40 or trapezoidal (FIG. 4g) openings 8a, which are implemented by a sandblasting or milling process.

Figure 4A:
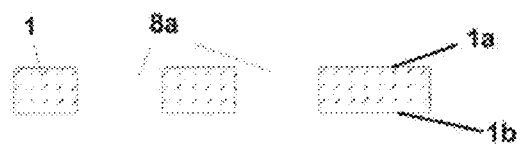
FIGS. 4a to 4i, FIG. 4k and FIG. 4m show the sequence of steps of an exemplary embodiment for producing a cover array 22 with inclined or, more specifically, inclined and shifted optical windows 3, according to the method of the invention, for deformation zones of different shapes and using different levels of pressure.
Figure 4B:
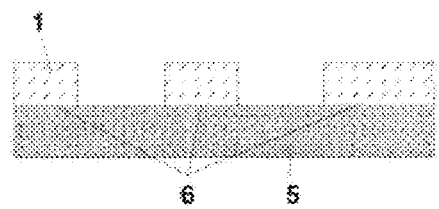
Figure 4C:
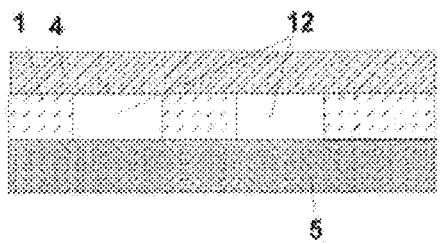

One side 1b of the glass wafer 1 is joined with a silicon wafer 5, which acts as a carrier 5, by anodic bonding, so that the process results in a hermetically sealed connection (FIG. 4b). The other side 1a of the glass wafer 1 is joined with an additional glass wafer 4, which is 850 μm thick and is made of a high temperature resistant or, more specifically, higher melting glass or, more specifically, silicate glass (for example, Corning Eagle XG®, Corning Lotus Glass®, Schott AF32 ®, Hoya SD2 ®), which acts as a functional layer 4, by fusion bonding or thermal bonding such that said other side of said glass wafer is hermetically sealed (FIG. 4c). As an alternative, the joining step can be carried out by means of anodic bonding, for which purpose in a previous step the additional glass wafer 4 is coated with a conductive layer, such as, for example, polysilicon.

The joining of the two glass wafers 1, 4 takes place at temperatures of about 400 deg. C. and a pressure of about 10 to 20 mbar or about 800 to 1,000 mbar.

The additional glass wafer 4 has planar, plane-parallel substrate planes on both sides; and the two wafer sides or, more specifically, the wafer planes are designed in such a way that they are polished and have a root mean square surface roughness of about 1 to 3 nm.

As a result of the glass wafer 1 being joined with the silicon wafer 5 and with the additional glass wafer 4, hermetically sealed cavities 12 are produced due to the openings 8a in the glass wafer 1 (FIG. 4c).

Figure 3A:
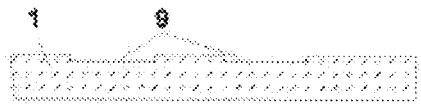
FIGS. 3a to 3h show the sequence of steps of an exemplary embodiment for structuring a glass wafer 1 for producing openings 8a by means of glass flow.
Figure 3B:
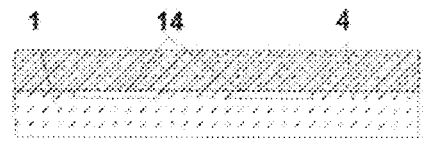
Figure 3C:
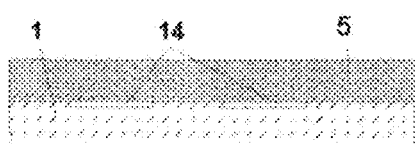

An alternative way for producing a glass wafer 1 with openings 8a is shown in FIGS. 3a to 3h. In this case in a first step, auxiliary depressions 9 are produced in the glass wafer 1 by etching, sandblasting, drilling, milling and/or laser beam machining (FIG. 3a). By joining the glass wafer 1 with an additional glass wafer 4 (FIG. 3b), which may represent the basis for the functional elements 2 in the further process and can act accordingly as a functional substrate or, more specifically, a functional layer 4, by means of fusion bonding or with a silicon wafer 5 (FIG. 3c), which can act as a carrier

5 in the further process, by means of anodic bonding, the auxiliary depressions 9 in the glass wafer 1 are closed in a hermetically sealed fashion. As an alternative, instead of the auxiliary depressions 9 in the glass wafer 1, auxiliary depressions 9 can also be formed in the silicon wafer 5 or in the additional glass wafer 4, in order to generate hermetically sealed cavities 14 between the glass wafer 1 and the silicon wafer 5 or the additional glass wafer 4.

Figure 3D:
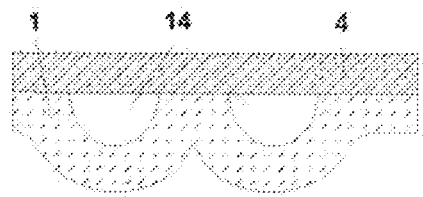
Figure 3E:
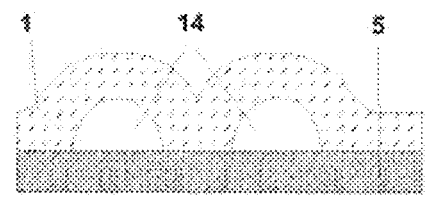
Figure 3F:
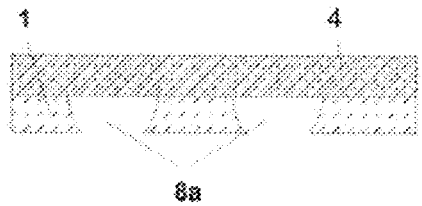
Figure 3G:
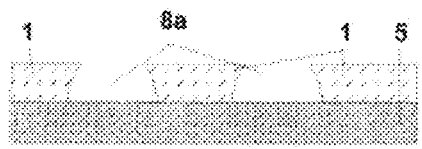
Figure 3H:
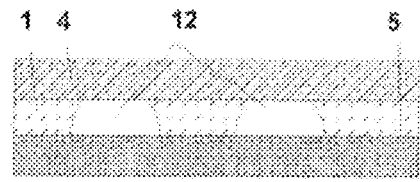

As part of the joining step, a pressure of about 800 to 1,000 mbar is generated in the cavities 14. By heating the glass wafer 1 made of borosilicate glass to 700 deg C. and, thus, to a temperature that is in the range of the softening temperature of borosilicate glass, the glass wafer 1 becomes soft or, more specifically, free flowing. In addition, the pressure in the cavities 14 increases to about 1,200 to 1,600 mbar. Since the heating takes place at atmospheric air pressure, the overpressure in the cavities 14 causes a deformation of the glass wafer 1 (FIGS. 3d, 3e). By grinding and polishing, the cavities 14 are opened (FIG. 3f, FIG. 3g), and the openings 8a are produced in the glass wafer 1. The side of the glass wafer 1 that has been ground flat can then be joined with a carrier 5 or a functional substrate 4, in order to close the openings 8a and to generate hermetically sealed cavities 12 (FIG. 3h).

Figure 4D:
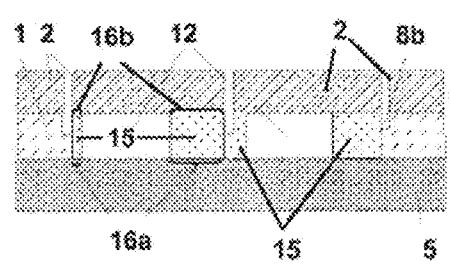
Figure 4E:
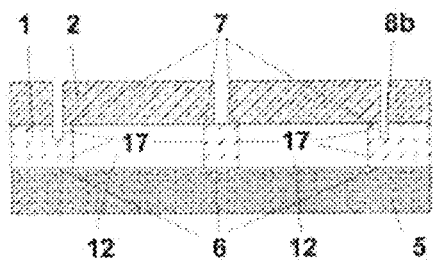
Figure 4F:
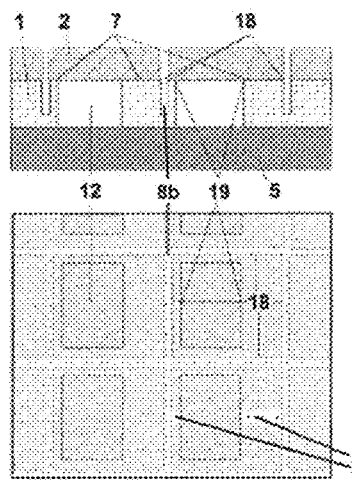
Figure 4G:
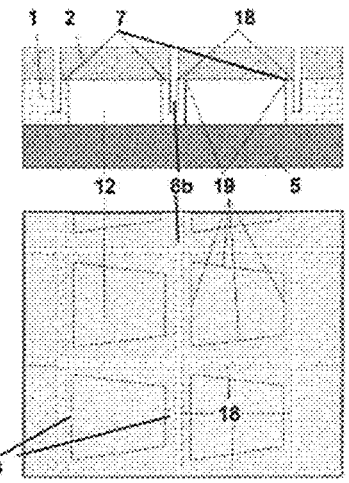
Figure 4H:
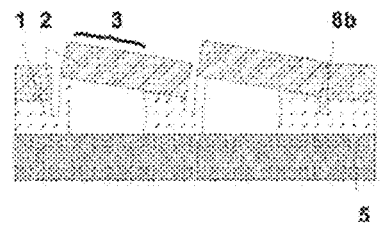
Figure 4I:
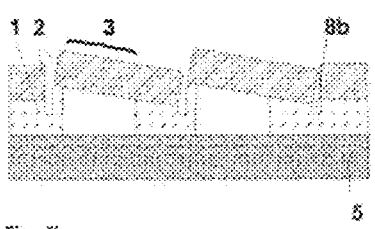
Figure 4K:
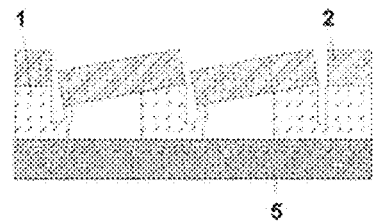
Figure 4M:
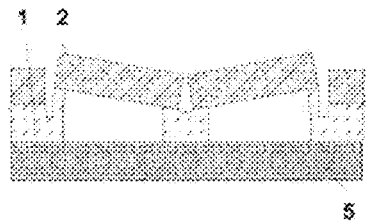

The structuring of the additional glass wafer 4 for producing several functional elements 2, which can act, for example, as optical windows 3, as well as for achieving a desired deformation zone 15 (FIG. 4d-finely dotted area of the glass wafer 1), is done by means of a sawing step, in which the hermetically sealed cavities 12 are retained (FIG. 4d). In this case the additional glass wafer 4 is sawed in such a way that in each case a generated functional element 2 closes one of the cavities 12 (FIGS. 4f and 4g). As an alternative, the functional elements 2 can be produced in such a way that in each case a functional element 2 closes the cavities 12, which are arranged in a column or, more specifically, vertically, according to FIG. 4f or, more specifically, FIG. 4g.

In addition, the same sawing step results in a structuring of the glass wafer 1, in which depressions 8b are produced, with the effect that the deformation zone 15 is designed so as to be, in particular, frame-shaped, and exerts an influence on the deformation resistance. In this way the deformation zone 15 is provided, in particular, with additional surface areas 17 in certain areas, in order to reduce the local deformation resistance of these areas of the deformation zone 15 (FIG. 4e) and to optimize the process in terms of the amount of material used and the time spent.

In addition or, more specifically, as an alternative, a resistance asymmetry of the deformation zone 15, shown in FIG. 4d, can be achieved by varying the width of the frame-shaped deformation zone 15. The plan views in FIGS. 4f and 4g show the differently configured second contact surfaces 7 between the glass wafer 1 and the functional elements 2 after the sawing step, with the shape of the second contact surfaces 7 being decisive for the shape of the deformation zone 15.

In order to ensure the desired resistance asymmetry, the outer edge 18 and the inner edge 19 of one of the frame-shaped second contact surfaces 7 are each described by a rectangle, the peripheral centers of which do not coincide, where in this case an axis of symmetry of the rectangle, describing the inner edge 19, and an axis of symmetry of the rectangle, describing the outer edge 18, lie on the same straight line. As a result, two opposite legs of the frame-shaped second contact surface 7 are designed such that their widths are the same; and the other two legs are designed such that their widths are different (FIG. 4f).

In the embodiment according to FIG. 4g, the outer edge 18 of one of the frame-shaped second contact surfaces 7 is described by a rectangle, whereas the inner edge 19 is described by an isosceles trapezoid. As a result, two opposing legs of the frame-shaped second contact surface 7 are designed to converge; and the other two legs are not, so that, taking into account a corresponding carrier 5 or, more specifically, a correspondingly shaped first contact surface 6, a resistance asymmetry of the deformation zone 15 is achieved.

In the following process step the layer system consisting of the glass wafer 1, the functional elements 2 and the silicon wafer 5 is heated. When a glass wafer 1 made of borosilicate glass with a softening temperature of about 820 deg. C. is used, the layer system is heated to about 700 deg. C., as a result of which the glass wafer 1 becomes soft and begins to flow. Since the softening temperature of the functional elements 2, which are made of a silicate glass (for example, Corning Eagle XG®), is 971 deg. C. and, thus, significantly higher than the softening temperature of the glass wafer 1, the shape of the functional elements 2 is maintained, so that optimal transmission of the deformation force to the glass wafer 1 is also guaranteed.

Due to the elevated temperature compared to that of the joining process, the pressure in the cavities 12 increases from about 10 to 20 mbar to about 20 to 30 mbar or from about 800 to 1,000 mbar to about 1,200 to 1,600 mbar. The correspondingly prevailing negative pressure or overpressure in relation to the atmospheric air pressure of the environment leads to a force, acting on the glass wafer 1, in particular, the deformation zone 15, that causes a deformation of the glass wafer 1 or, more specifically, the deformation zones 15.

The resistance asymmetry of the respective deformation zone 15 results in a tilting (FIG. 4i-overpressure in the cavity 12, FIG. 4k-negative pressure in the cavity 12) or a tilting and shifting (FIG. 4h and FIG. 4m—overpressure in the cavity 12) of the functional element 2 defining the respective cavity 12. The deformation step is terminated upon contact of the respective functional element 2 with a deflection delimitation, for example, an adjacent functional element (FIG. 4m), or after the pressure in the cavities 12 has reached the value of the ambient pressure as a result of deformation.

In a further step the silicon wafer 5 is selectively removed from the glass wafer 1 by wet chemical etching in potassium hydroxide; and the cover array 22 is separated from the molded glass wafer 1 and the functional elements 2, where as an alternative the separation process can also take place after the encapsulation process, as already described with respect to FIGS. 2a to 2d.

Figure 5A:
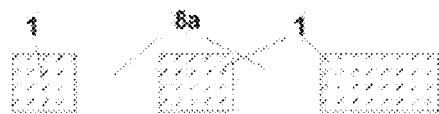
Figure 5B:
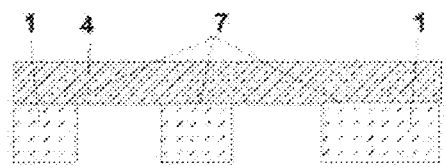
Figure 5C:
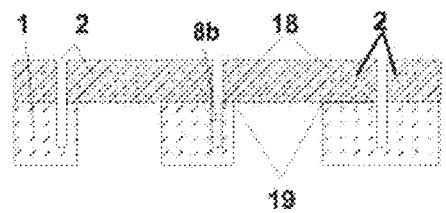
Figure 5D:
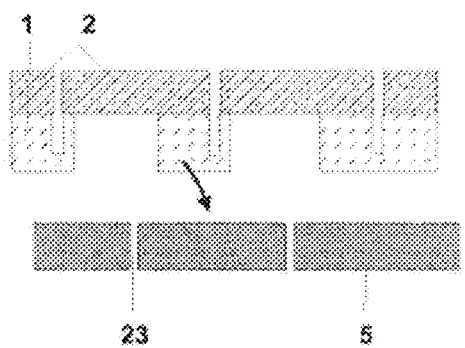

In another exemplary embodiment according to FIGS. 5a to 5g, a tool or, more specifically, a support with venting channels 23 is used, instead of a silicon wafer, as the carrier 5. After the glass wafer 1 made of borosilicate glass has been joined with the additional glass wafer 4 (FIG. 5b) and after the structuring of both glass wafers 1, 4 by means of a sawing step for producing functional elements 2 and for shaping the deformation zones 15 (FIG. 5c), the structured glass wafer composite consisting of the glass wafer 1 and the functional elements 2 is brought in an aligned manner into contact with the support 5, which acts as a carrier 5, where in this case the support 5 is made of graphite; or, more specifically, wherein at least the surface areas of the support 5, which are brought into contact with the structured glass wafer composite 1, 2, are coated with graphite (FIG. 5d).

Figure 5E:
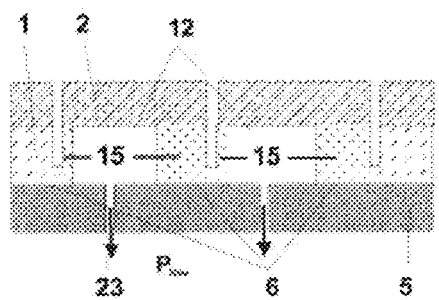
Figure 5F:
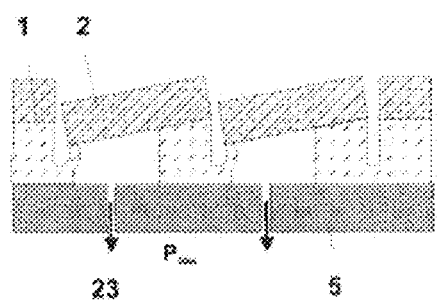
Figure 5G:
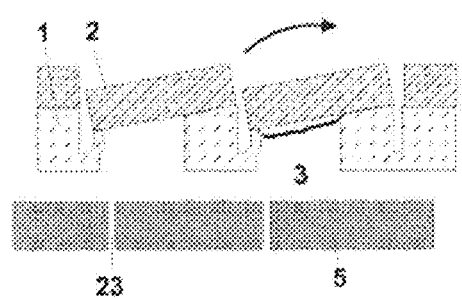

The venting channels 23 of the support 5 are adapted to the structure of the structured glass wafer composite 1, 2, so that each of the cavities 12, which are closed by the structured glass wafer composite 1, 2 and the support 5, is in communication with at least one venting channel 23 (FIG. 5e). During the subsequent heating and deforming, a pressure level that is below the ambient pressure (for example, atmospheric air pressure) is generated in the cavities 12 through the venting channels 23 by means of a vacuum pump. Owing to the resulting action of the force on the functional elements 2 or, more specifically, on the deformation zones 15 and owing to the configuration of the deformation zones 15, a resulting torque, acting on each functional element 2, is generated, an aspect that in conjunction with the free-flowing borosilicate glass of the glass wafer 1 that is caused by the heating results in the functional element 2 tilting or, more specifically, tipping in the direction of the support 5 (FIG. 5f). After the desired inclination has been reached, the ambient pressure is set in the cavities 12 through the venting channels 23, so that the molded glass wafer composite 1, 2 can be removed from the support 5 (FIG. 5g). The support 5 can be reused for another process run.

In addition to ensuring a pressure differential in order to generate a force effect, the deformation force can also be introduced by way of a shaping apparatus 30, as shown in FIGS. 6a to 6f and FIGS. 7a to 7e.

Figure 6A:
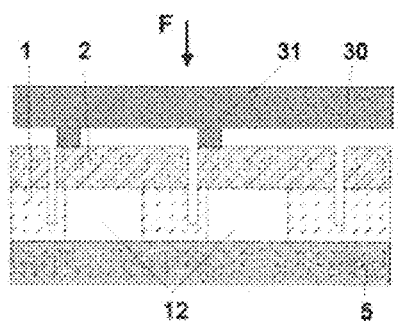
Figure 6D:
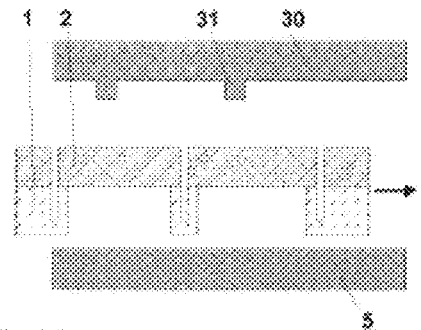
Figure 6B:
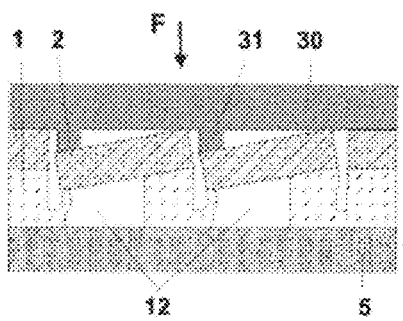
Figure 6E:
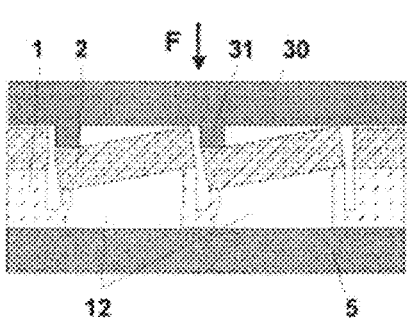
Figure 6C:
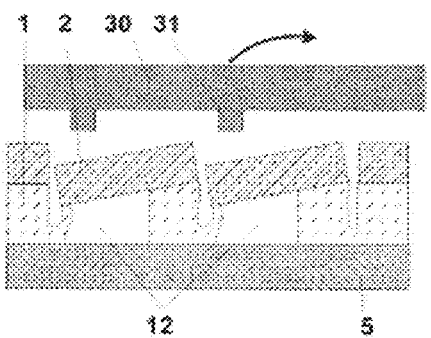
Figure 6F:
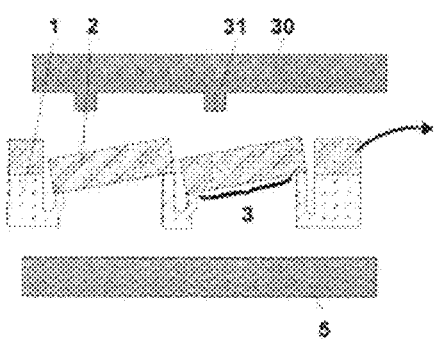
Figure 7A:
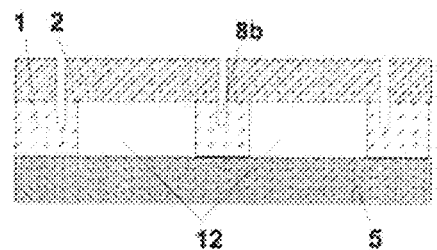
Figure 7B:
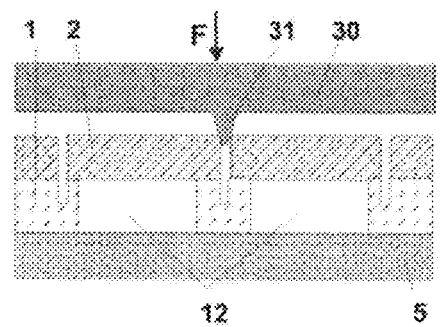
Figure 7C:
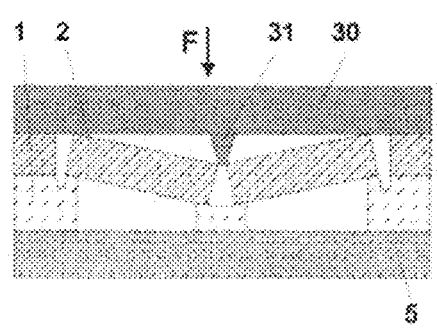
Figure 7D:
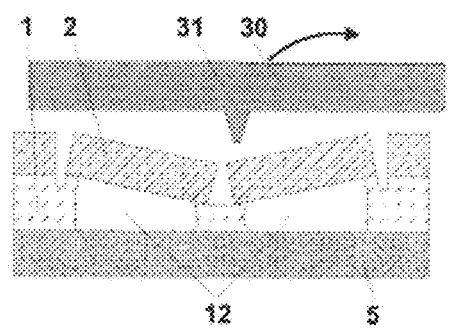
Figure 7E:
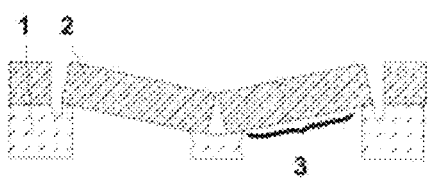

FIGS. 6a to 6c show a variant using a silicon wafer as the carrier 5; and FIGS. 6d to 6f show a variant using a support as the carrier 5. In this case both the shaping apparatus 30 and the support 5 are made of a material or are coated with a material, such as, for example, graphite, that, when heated and deformed, adheres as little as possible to the structured or, more specifically, shaped glass wafer composite 1, 2. By suitably aligning the shaping apparatus 30, the deformation force can be introduced in a targeted manner in such a way that a tilting of the functional elements 2 or, more specifically, the optical windows 3 is ensured. A tilting can also be supported by the resistance-asymmetrical deformation zones 15 (FIGS. 6a to 6c). In addition, the shaping apparatus 30 may be designed in such a way that it simultaneously acts as a stop, in order to achieve precisely a predetermined angle of inclination of the optical window 3. As an alternative, the deformation force is maintained until the desired inclination of the functional element 2 has been reached. After heating and shaping, the shaping apparatus 30 is removed from the molded glass wafer composite 1, 2, so that the molded glass wafer composite 1, 2 can be detached from the support 5 (FIG. 6f) or removed from the silicon wafer 5.

FIGS. 7a to 7e show the use of a shaping apparatus 30 with a wedge-shaped punch element 31. In particular, the surface of the punch element 31 in turn is made of graphite or is coated with graphite and due to its shape makes possible a self-aligned mounting of the shaping apparatus 30 on the structured glass wafer composite 1, 2. The shaping apparatus 30 in turn can act as a stop, so that a precise angle of inclination of the functional elements 2 can be set.

In a further exemplary embodiment, the punch element 31 has an inclined punch surface that exhibits the inclination desired for the optical windows 3.

According to the exemplary embodiment according to FIGS. 8a to 8e, the structured glass wafer composite 1, 2 (FIG. 8a) consisting of the borosilicate glass wafer 1 and the functional elements 2 (for example, optical windows 3) are brought into contact in an aligned manner with a support 5 (FIGS. 8b to 8c), which comprises, in addition to venting channels 23, the supporting structures 21.

After the contact has been established, a pressure, which is below the ambient pressure, is set in the cavities 12 through the venting channels 23 by means of a vacuum pump. By heating the glass wafer 1 up to the vicinity of its softening temperature, said glass wafer is brought into a free flowing state, so that the deformation zone 15 is deformed by the action of forces, caused by the pressure differential, on the structured glass wafer composite 1, 2. Due to a targeted local support of the structured glass wafer composite 1, 2 by means of the supporting structures 21, it is possible to ensure resulting torques on the functional elements 2 and to achieve a tilting of the functional elements 2 relative to the support 5 or, more specifically, to the initial position of the functional elements 2.

Figure 9A:
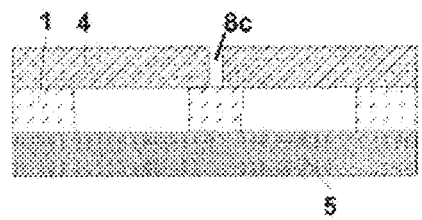
Figure 9B:
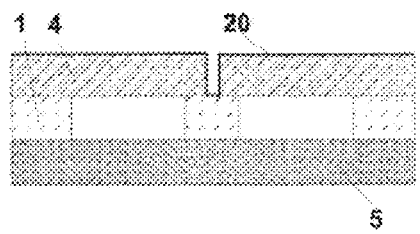
Figure 9C:
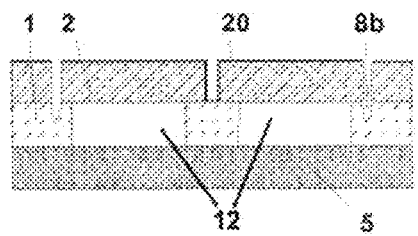
Figure 9D:
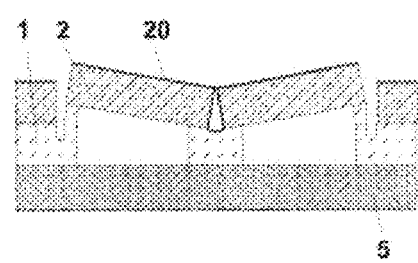
Figure 9E:
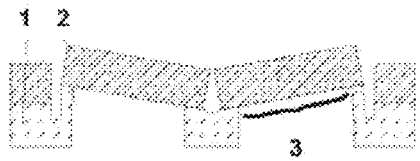

FIGS. 9a to 9e show an exemplary embodiment for producing a cover array 22 with inclined optical windows 3, in which the tilting of the functional elements 2 is assisted by the use of a stabilization layer 20. At the same time the glass wafer composite 1, 4, consisting of the glass wafer 1 and the additional glass wafer 4, is structured after joining with a silicon wafer as the carrier 5 in such a way that in a first sawing step those areas of the additional glass wafer 4 are structured that are to be deflected as little as possible in the step of heating and deforming (FIG. 9a). The saw cut is made so deep that the generated depression 8c is partially bounded by the glass wafer 1. Subsequently the additional glass wafer 4, which has been structured in this way, and the depression 8c are coated with a stabilization layer 20 made of silicon. The deposition of the silicon layer 20 of about 1 to 5 μm thickness can be carried out by a PVD or CVD method. As an alternative, the saw cut can be made so deep that one portion of the additional glass wafer 4 is retained as a stabilization layer.

Owing to its deformation, the stabilization layer 20 additionally counteracts the deformation force and also stabilizes the area of the glass wafer 1 that is covered by said stabilization layer. Since this area of the glass wafer 1 is adjacent to the deformation zone 15 and interacts with the latter, the stabilization layer 20, which is linearly adjacent to the deformation zone 15, also causes a local increase in the deformation resistance of the deformation zone 15.

In another sawing step the final structuring of the glass wafer composite 1, 4 for producing the functional elements 2 or, more specifically, the optical windows 3 is carried out. The areas of the deformation zones 15 that are made by this sawing step are not stabilized by the silicon layer 20 (FIG. 9c), because they are intended for greater deflection. As a result, a tilting of the functional elements 2 during heating and deforming is ensured (FIG. 9d, when using an overpressure in the cavities 12). The silicon layer 20 also stabilizes and fixes the functional elements 2 in their position. By using a stabilization layer 20, it is possible to design the areas of the deformation zones 15, which are intended for a smaller deflection and which are to exhibit a correspondingly higher deformation resistance, so as to save more space (for example, are designed narrower).

Finally, the silicon carrier 5 is removed (FIG. 9e); and the molded glass wafer composite 1, 2 can be separated directly or after encapsulation of a complete wafer.

FIGS. 10a to 13f show the sequence of steps of various exemplary embodiments for producing a cover array 22 with inclined or, more specifically, shifted and inclined optical windows 3, in which a cavity 13 between the carrier 5 and the deformation element 1 is used to ensure the desired inclination or, more specifically, shift and inclination of the functional elements 2 or, more specifically, the optical windows 3.

One or more cavities 13 between the carrier 5 and the deformation element 1 can be formed by making the glass wafer 1, made of borosilicate glass, and/or the silicon wafer 5 with one or more depressions 8b, 10, which enclose one or more cavities 13 after contact or, more specifically, after joining the glass wafer 1 with the silicon wafer 5. The connection between the glass wafer 1 and the silicon wafer 5 is produced by fusion bonding, as a result of which the cavity 13 can be hermetically sealed; and, thus, a pressure can be set that may be different from both the ambient pressure and the pressure in the cavities 12. The pressure in the cavities 12 can then be adjusted when the additional glass wafer 4 is joined with the glass wafer 1.

Figure 13A:
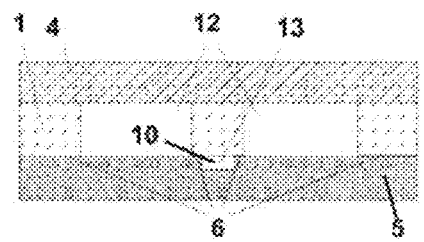
Figure 13B:
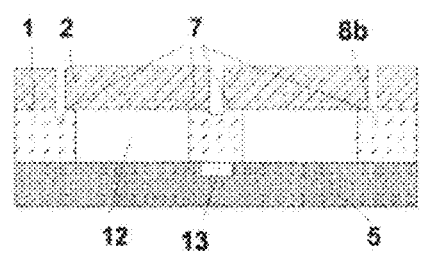
Figure 13C:
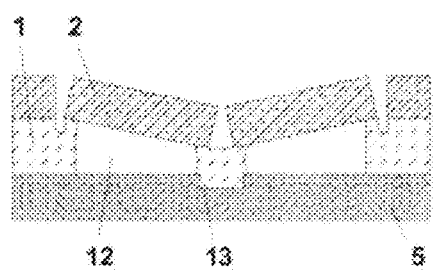
Figure 13D:
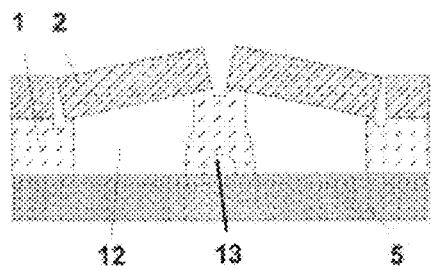
Figure 13E:
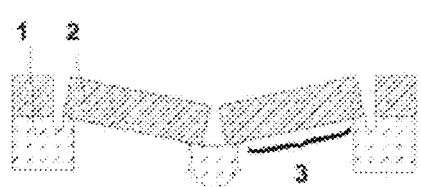
Figure 13F:
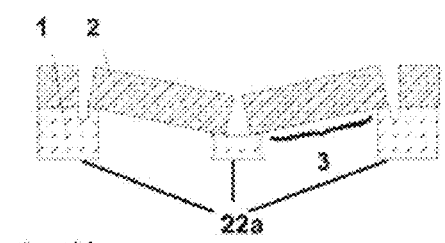
Figure 14A:
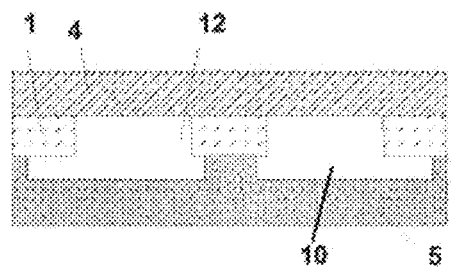
Figure 14B:
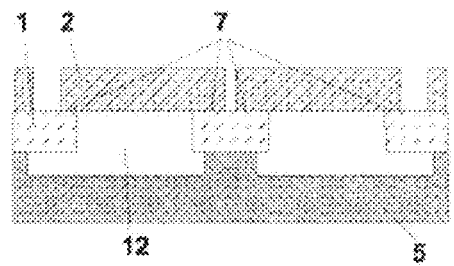
Figure 14C:
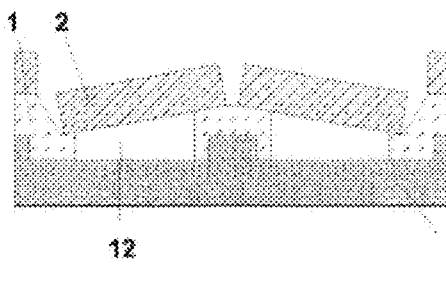
Figure 14D:
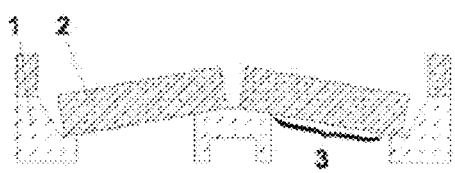

The pressure in the cavities 12 between the functional element 2, the glass wafer 1 and the silicon wafer 5 is set in such a way that the pressure in the cavities 12 corresponds to the ambient pressure in the process step of heating and deforming. As a result, there is no pressure differential between the cavities 12 and the external environment that would mechanically load the functional elements 2 or, more specifically, the optical windows 3. As a result of the decrease in the mechanical load on the functional elements 2 that is achieved in this way, their original shape can also be maintained particularly well even during the heating and deforming. A force effect causing the deformation is achieved by the pressure differential between the cavity 13 and the surrounding environment or, more specifically, the cavities 12. An overpressure in the cavity 13 of about 100 to 200 mbar then leads to a deflection of the functional elements 2 and, thus, the optical windows 3, according to FIG. 10d and FIG. 13d; a negative pressure of about 100 to 200 mbar leads to a deflection, according to FIG. 10h and FIG. 13c. In the case of an overpressure in the cavity 13 the heating and deforming can be carried out in a vacuum furnace, where in this case the same pressure is set in the cavities 12 as in a vacuum furnace. In the case of a negative pressure in the cavity 13, the heating and deforming can be carried out at atmospheric air pressure in the furnace as well as in the cavities 12. The result, according to FIG. 13e, is reworked by grinding and/or polishing, in order to provide flat contacting surfaces 22a for the encapsulation step (FIG. 13f).

Figure 10I:
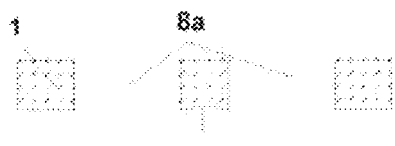
Figure 10I:
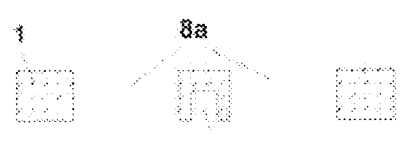
Figure 10I:
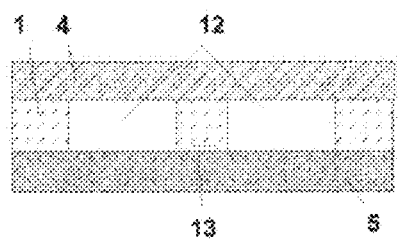
Figure 10I:
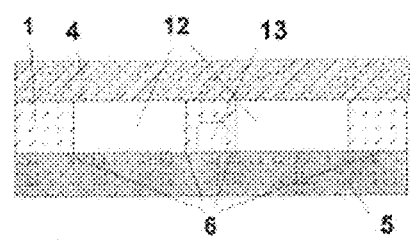
Figure 10I:
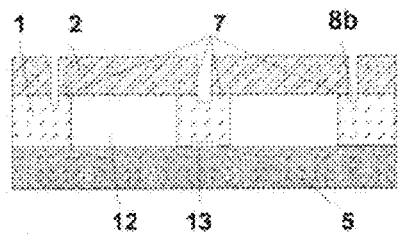
Figure 10I:
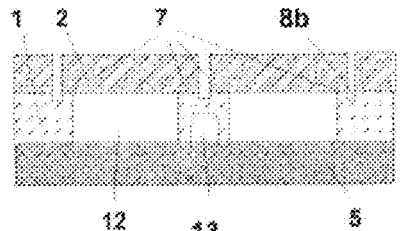
Figure 10I:
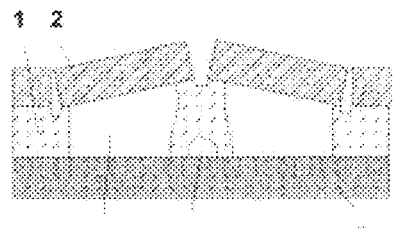
Figure 10I:
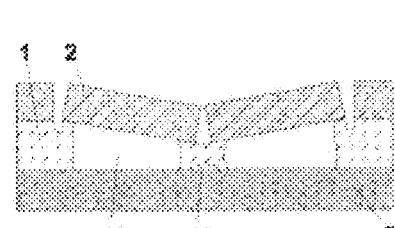
Figure 10I:
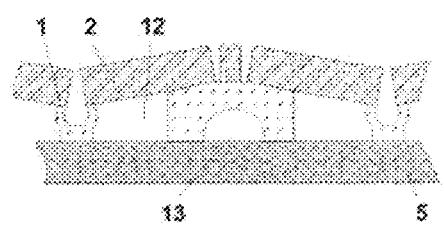

In an additional exemplary embodiment there is an overpressure, as compared to the ambient pressure in the cavity 13, during the heating and deforming; and in the cavities 12 there is a negative pressure, resulting in a deformation, according to FIG. 10i.

Figure 11A:
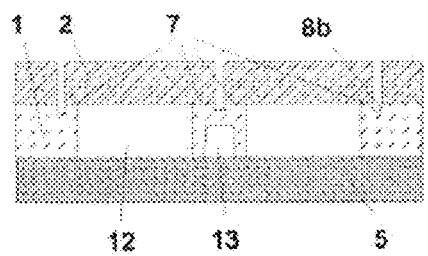
Figure 11D:
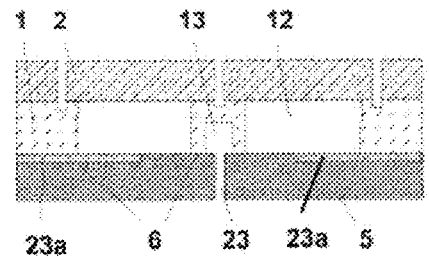
Figure 11B:
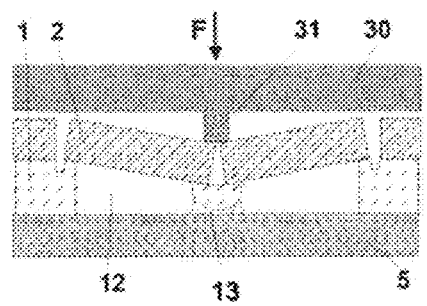
Figure 11E:
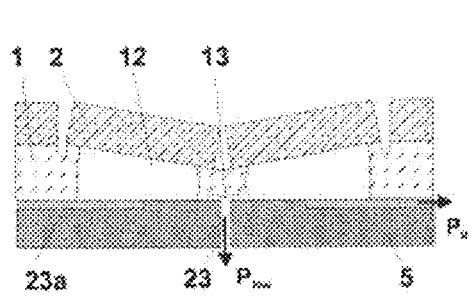
Figure 11C:
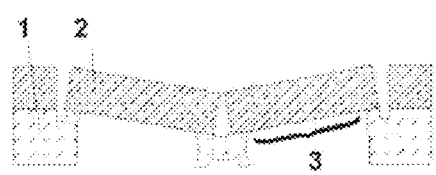
Figure 11F:
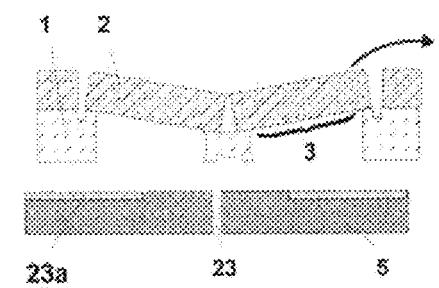

As an alternative, the required pressure differentials can be set by using a corresponding support 5 with one or more venting channels 23 and compensating channels 23a, as shown in FIGS. 11d to 11f. In this case the compensating channels 23a establish a connection of the cavities 12 to the environment, in order to avoid or, more specifically, to reduce or, more specifically, to minimize a pressure differential. A pressure that is below the ambient pressure is set in the cavity 13 through the venting channel 23 by means of a vacuum pump.

The shaping may act in a supportive manner and correspondingly, in addition to the introduction of force using a pressure differential or may act alone (without the introduction of force based on a pressure differential) as already described above, and in these cases, too, a special shaping apparatus 30 can be used (FIG. 11b).

Figure 12A:
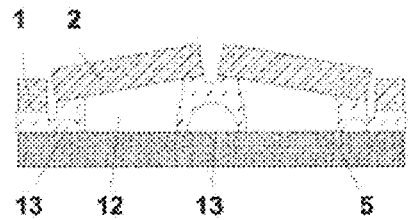
Figure 12B:
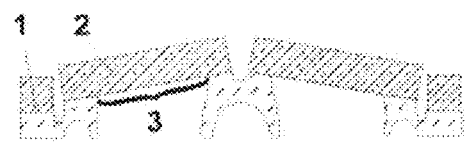

FIGS. 12a to 12b also show an exemplary embodiment, in which a plurality of cavities 13, which are of different designs and/or are acted upon by different levels of pressure, are used between the glass wafer 1 and the silicon wafer 5, in order to achieve deflections of the functional elements 2 that are locally of varying intensity and, thus, a tilting or, more specifically, a tilting and shifting of the functional elements 2 or, more specifically, the optical windows 3.

FIGS. 14a to 14d show the sequence of steps of another exemplary embodiment for producing a cover array 22 with inclined and shifted optical windows 3, according to the method of the invention, using depressions 10 in the carrier 5, wherein in comparison to the ambient pressure, a negative pressure is set in the cavities 12, for the purpose of introducing force and to cause the deformation.

Figure 15A:
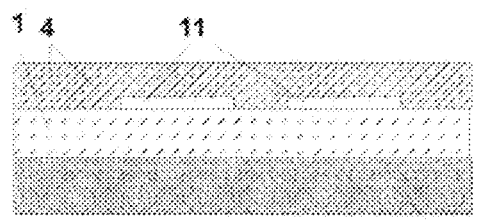
Figure 15B:
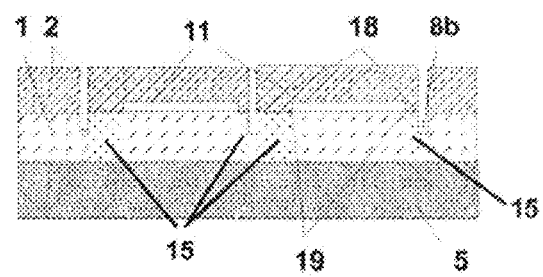
Figure 15C:
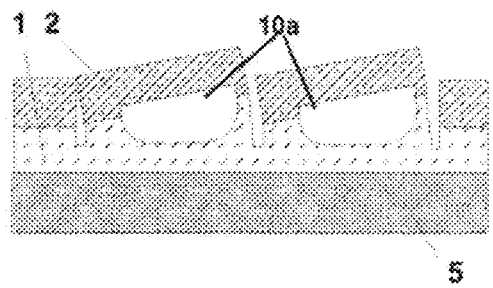
Figure 15D:
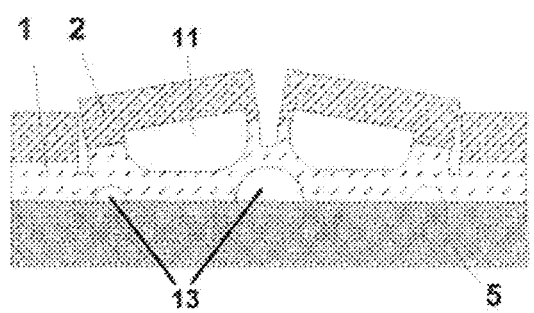

FIGS. 15a to 15d show the sequence of steps of a further exemplary embodiment for producing a cover array 22 with inclined and shifted optical windows 3, according to the method of the invention, using cavities 11 between the deformation element 1 (a glass wafer made of borosilicate glass) and the functional elements 2. The base for the cavities 11 are the functional elements 2, which have depressions 10a. The functional elements 2 are pushed away from the glass wafer 1 by means of an overpressure that is set, in comparison to the ambient pressure, in the cavities 11 (FIG. 15c). In addition to the cavities 11, it is possible to provide cavities 13 (FIG. 15d), as a result of which an additional pressure-induced introduction of force can be ensured.

As a result of the varying configuration of the deformation zone or, more specifically, the deformation zones 15 (FIG. 15b) in certain areas, a tilting of the functional elements 2 is achieved. After the removal of the silicon wafer 5, the cavities 11 or, more specifically, the cavities 13 are opened by grinding and/or polishing.

In a modified process variant, it is possible to dispense with the cavities 11 (FIG. 15b). In this case a force may be introduced, for example, by a magnetic interaction. The local differences in the deformation resistance of the deformation zones 15 for supporting a tilting of the functional elements 2 are ensured, inter alia, by the fact that the contact between the functional elements 2 and the glass wafer 1 leads to a connection only in those areas, in which the introduced force is to be transmitted from the functional elements 2 to the glass wafer 1, in order to achieve the desired deformation. In the non-interconnected contact areas between the glass wafer 1 and the functional elements 2, the contact between the functional elements 2 and the glass wafer 1 is terminated due to the deformation of the deformation zones 15; and in this way a cavity 11 is generated between the functional elements 2 and the glass wafer 1; equivalent to the representation in FIG. 15c, but without depressions 10a in the functional elements 2.

Figure 16A:
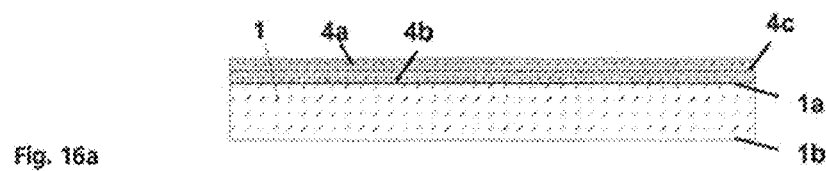
Figure 16B:
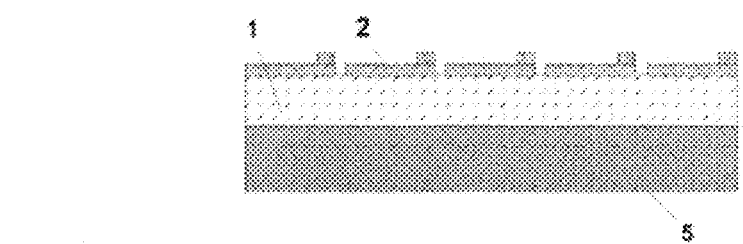
Figure 16C:
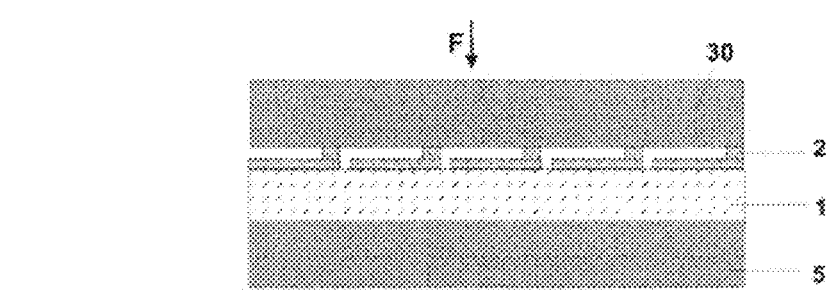
Figure 16D:
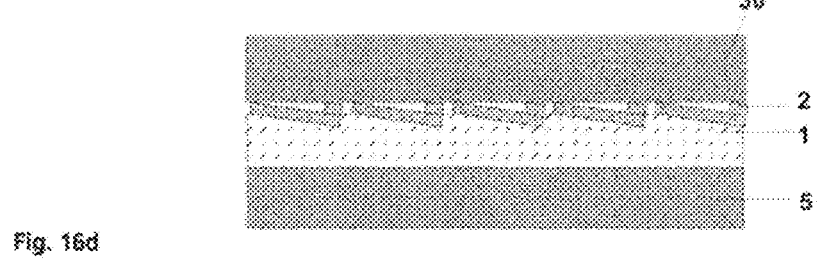
Figure 16E:
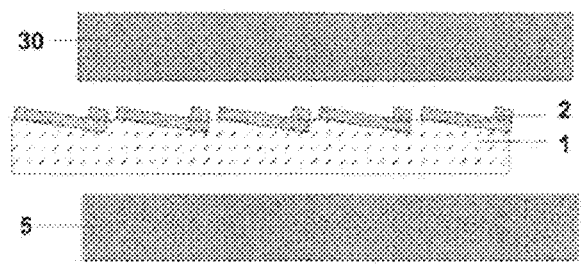
Figure 16F:

FIGS. 16a to 16f show an exemplary embodiment for structuring a glass wafer 1, which is made of borosilicate glass, has a thickness of 725 µm and is flat on both sides, in order to produce one or more prisms or inclined mirrors. In order to produce a prism array, a sequence of layers, each consisting of 200 µm thick silicon layers 4a, 4b and an interposed 1 µm thick silicon dioxide layer 4c, is applied or, more specifically, deposited on the glass wafer 1 comprising a wafer side 1a of the substrate surfaces 1a, 1b that are flat on both sides. Functional elements 2 are generated by structuring the layer sequence 4a, 4b, 4c (FIG. 16b). By using such a sequence of layers, the accuracy of the structuring for producing the functional elements 2 can be improved. As an alternative, a 400 µm thick silicon layer can be applied or, more specifically, deposited as a functional layer 4 and then structured. The functional elements 2 can fulfill both the function of a shaping element and a protective and/or molding element. As a shaping element, these functional elements 2 transmit or, more specifically, distribute the introduced force to/over the glass wafer 1, as a result of which said glass wafer is deformed. As a protective element, the functional elements 2 can retain the available high surface quality of the glass wafer 1. On the other hand, as a molding element, a high surface quality of the functional elements 2 can be molded or, more specifically, transferred on/to the glass wafer 1. The force for deforming the glass wafer 1 is introduced by bringing a shaping apparatus 30, made of quartz glass, into contact with the structured silicon layer 4a (FIG. 16c). Due to the asymmetrical structuring of the two silicon layers 4a, 4b, a tilting of the functional elements 2 is achieved (FIG. 16d). In addition, the functional elements 2 can take over the functionality of a stop owing to the structuring, since upon reaching the desired inclination of the functional elements 2, the shaping apparatus 30 comes into contact with the structured silicon layer 4b; and a further tilting is prevented (FIG. 16d). After the removal of the shaping apparatus 30 and the removal of the functional elements 2, the structured glass wafer 1 can be used as a prism array or separated into several prisms.

In the case of the production of a mirror array an aluminum layer can be deposited as a reflective coating on the functional elements 2 or on the structured glass wafer 1 or, more specifically, its inclined transmission surfaces 3a after the heating and deforming.

Figure 17A:
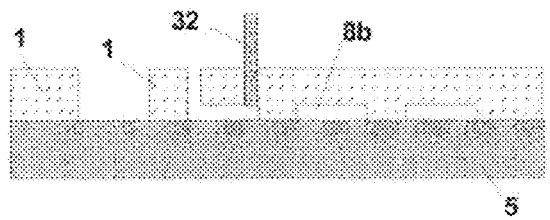
Figure 17B:
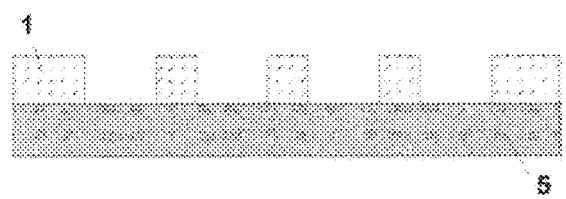
Figure 17C:
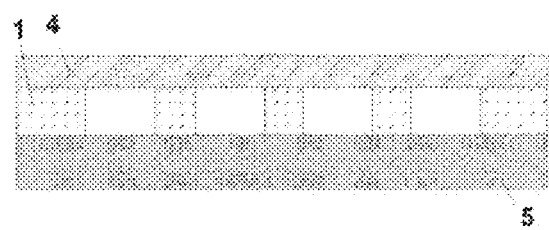
Figure 17D:
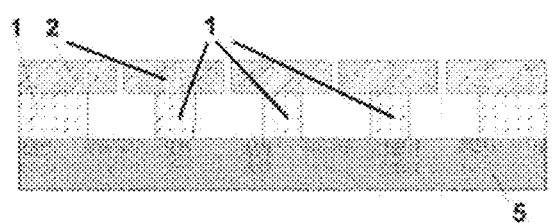
Figure 17E:
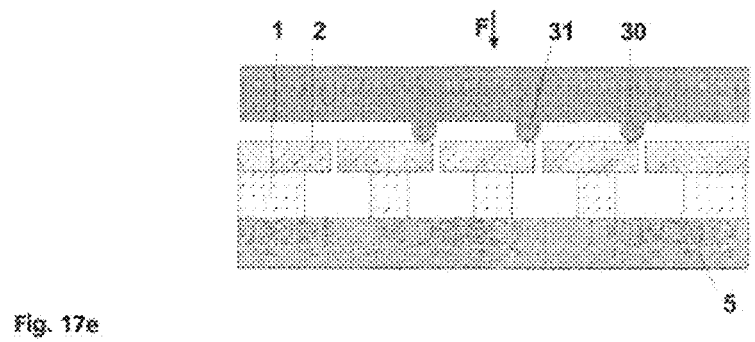
Figure 17F:
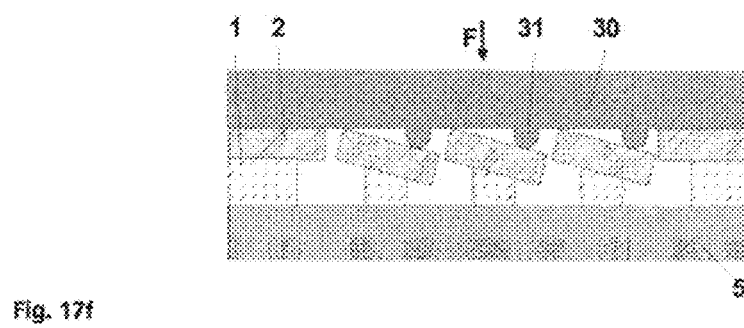
Figure 17G:
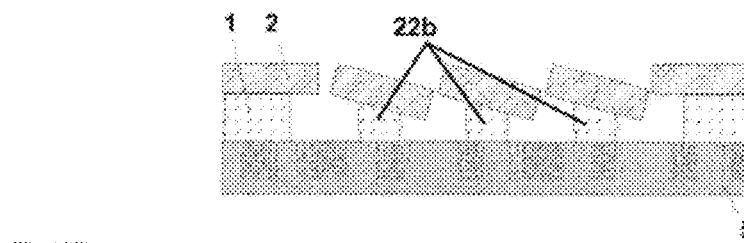
Figure 18A:
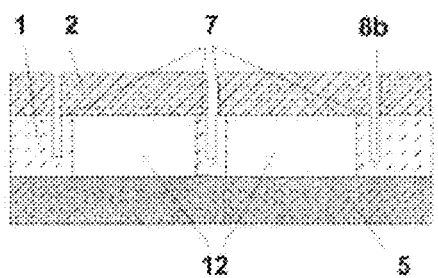
Figure 18B:
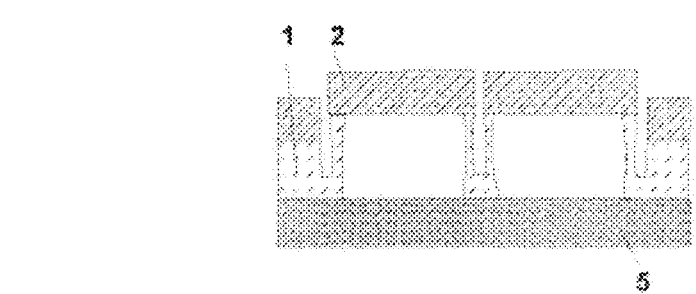

An additional exemplary embodiment for producing one or more prisms or inclined mirrors, according to the method of the invention, is shown in FIGS. 17a to 17g. After a glass wafer 1, which is made of borosilicate glass and which has depressions 8b, which are to prevent contact of the saw 32 with the silicon wafer 5, in the following sawing step for the production of island structures 1, was bonded to a silicon wafer 5 by means of fusion bonding, individual island structures (FIGS. 17a to 17b) are produced from the glass wafer 1 as the deformation elements 1 in a sawing step. As an alternative, the island structures 1 may be generated (for example, by sawing) prior to joining with the silicon wafer 5 and are arranged on the silicon wafer 5 by vacuum handlers. By joining a quartz glass wafer 4 with the island structures 1 (FIG. 17c) and subsequent structuring of the quartz glass wafer 4 by means of sawing, a plurality of functional elements 2 are produced (FIG. 17d), where as an alternative, the generation of the functional element 2 can take place again prior to joining with the island structures 1. As a result, each island structure 1 is connected to a functional element 2; but it is also possible for several island structures 1, which are arranged, for example, in a row or, more specifically, a column, to be joined with a functional element 2. The deformation force is introduced by means of a shaping apparatus 30 (FIG. 17e), so that a tilting of the functional elements 2 is effected (FIG. 17f).

If the functional elements 2 have been provided with a reflective finishing coating, then the optical components that are produced can be used, for example, as inclined mirrors. As an alternative, after removal of the functional elements 2 and/or the silicon wafer 5, prisms are available as optical components.

FIGS. 18a to 18b and FIGS. 19a to 19b show two exemplary embodiments, which show the production of a cover array 22, according to the method of the invention, with shifted optical windows 3.

In both examples the introduction of the force for the deformation is again based on a pressure differential between the pressure in the cavities 12 (in the example shown in FIGS. 18a to 18b, an overpressure; and in the example shown in FIGS. 19a to 19b, a negative pressure) and the ambient pressure. As a result of the resistance symmetrical configuration of the deformation zone 15, a tilting of the optical windows 3 by the deformation of the borosilicate glass wafer 1 is avoided; and a shift is achieved.

Figure 19A:
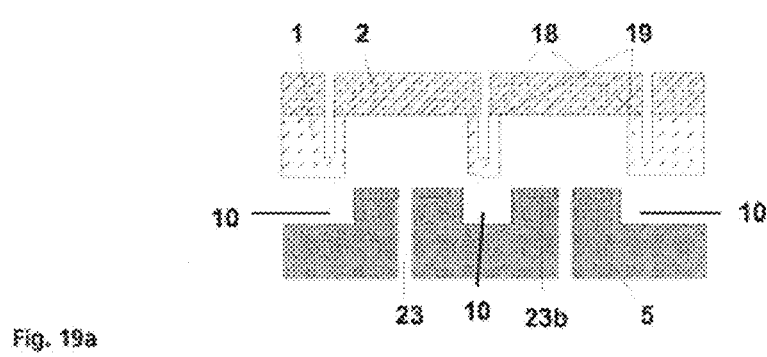
Figure 19B:
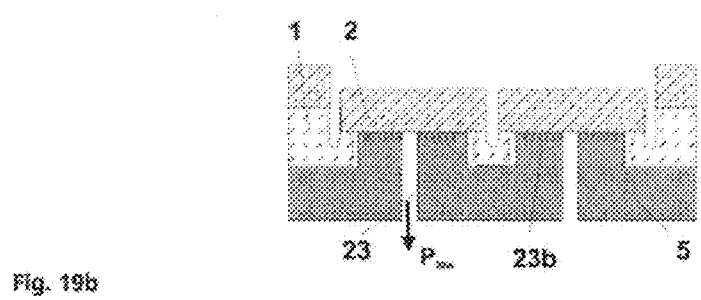

According to the exemplary embodiment shown in FIGS. 19a to 19b, the setting of the pressure in the cavities 12 does not take place as part of the previous joining steps, but rather by means of venting channels 23 and venting depressions 23b, which improve a two-dimensional venting, in the support 5, by means of which the desired pressure is set by means of a vacuum pump. Due to the cavities 10 in the support 5, the desired deflection of the optical windows 3 can be adjusted, where in this case the support 5 acts as a deflection delimitation. As a result, it is possible to manufacture particularly precise optical components.

LIST OF REFERENCE NUMERALS

1 deformation element
1a, 1b wafer sides or, more specifically, substrate surfaces of the deformation element
2 functional element
3 optical window
3a transmission surface, for example, of the optical window or the prism
4 functional substrate or, more specifically, functional layer
4a, 4b silicon layers
4c silicon oxide layer
5 carrier (for example, silicon substrate, graphite support)
6 first contact surface
7 second contact surface
8a opening in the deformation element
8b depression in the deformation element
8c depression for the stabilization layer
9 auxiliary depression
10 depression in the carrier
10a depression in the functional element
11 cavity between functional element or functional substrate/functional layer and deformation element
12 cavity between functional element or functional substrate/functional layer, deformation element and carrier
13 cavity between deformation element and carrier
14 cavity based on the auxiliary depression
15 deformation zone
16a overlapping area of the first contact surface
16b overlapping area of the second contact surface
17 surface area of the deformation zone
18 outer edge of the second contact surface
19 inner edge of the second contact surface
20 stabilization layer
21 supporting structure of the carrier
22 cover or, more specifically, cover array
22a contact surface of the cover or, more specifically, the cover array
22b array of prisms or inclined mirrors
23 venting channel or aerating channel
23a compensation channel
23b venting depression
24 carrier substrate
25 micromirror
26 suspension of the micromirror
27 contact pads
28 incident radiation
29 deflected radiation
30 shaping apparatus
31 punch element, for example, with straight, inclined, wedge-shaped or cone-shaped punch surface
32 saw
33 frame segment

The invention claimed is:

1. Method for producing optical components with the following process steps of:
    providing a deformation element (1) and a carrier (5), wherein the deformation element (1) is a substrate or is fabricated from a substrate,
    bringing the deformation element (1) into contact with the carrier (5), as a result of which at least one first contact surface (6) is formed between the deformation element (1) and the carrier (5),
    applying a functional element (2) to the deformation element (1) in such a way that at least one second contact surface (7) is formed between the functional element (2) and the deformation element (1), said second contact surface overlapping at least partially the first contact surface (6), so that at least one deformation zone (15) is formed by means of the area of the deformation element (1) that is formed between the overlapping areas (16a, 16b) of the two contact surfaces (6, 7), wherein the deformation zone (15) is designed so as to be frame-shaped and/or wherein at least two deformation zones (15) are formed that are in contact with the same functional element (2),
    heating and deforming at least one portion of the deformation zone (15) in such a way that the functional element (2) is at least partially deflected, in particular, shifts and/or tilts,
    joining the functional element (2) with the deformation element (1) during the process step of applying the functional element (2) to the deformation element (1) and/or during the process step of heating and deforming the deformation zone (15).

2. Method, as claimed in claim 1, characterized in that the deformation element (1) contains glass, preferably a silicate glass, more preferably borosilicate glass and/or a glass-like material or is made thereof, in at least one area.

3. Method, as claimed in claim 1, characterized in that the functional element (2) contains a semiconductive material, in particular, silicon, glass, preferably silicate glass, more preferably silicate glass with alkaline earth additives, and/or a glass-like material or is made thereof, in at least one area.

4. Method, as claimed in claim 1, characterized in that the functional element (2) is an optical element, in particular, an optical window, a mirror, a partially transmissive mirror, a beam splitter, a prism, a lens and/or an interference filter.

5. Method, as claimed in claim 1, characterized in that the functional element (2), the deformation element (1) and/or the carrier (5) comprises a depression and/or opening (8a, 8b, 10, 10a).

6. Method, as claimed in claim 5, characterized in that bringing the deformation element (1) into contact with the carrier (5) and/or applying the functional element (2) to the deformation element (1) is/are carried out in such a way that a cavity (13, 11, 12) between the deformation element (1) and the carrier (5), between the deformation element (1) and the functional element (2) and/or between the functional element (2), the deformation element (1) and the carrier (5) is formed by the depression and/or opening (8a, 8b, 10, 10a), wherein the cavity (13, 11, 12) is, in particular, hermetically sealed.

7. Method, as claimed in claim 6, characterized in that a pressure below or above the ambient pressure, in particular, the atmospheric air pressure, is generated in the cavity (13, 11, 12), in particular, before and/or during heating and deforming.

8. Method, as claimed in claim 1, characterized in that the difference between the coefficient of thermal expansion of the material of the deformation element (1) and the coefficient of thermal expansion of the material of the functional element (2) is less than or equal to 5 ppm/deg K, in particular, less than or equal to 1 ppm/deg K.

9. Method, as claimed in claim 1, characterized in that at least one area of the surface of the functional element (2) has a root mean square surface roughness of less than or equal to 25 nm, preferably less than or equal to 15 nm, more preferably less than or equal to 5 nm and/or a deviation from planarity per measured length of less than or equal to 180 nm/mm, in particular, less than or equal to 100 nm/mm.

10. Method, as claimed in claim 1, characterized in that the application of the functional element (2) to the deformation element (1) is carried out in such a way that the functional element (2) is detached from a functional substrate (4) and is brought into contact with the deformation element (1) and/or that the functional element (2) is generated by structuring a functional layer (4), applied to the deformation element (1).

11. Method, as claimed in claim 1, characterized in that the overlapping areas (16a, 16b) of the first (6) and/or second contact surface (7) and/or the deformation zone (15) are designed so as to be frame-shaped, in particular, around the depression and/or opening (8a, 8b) in the deformation element (1); and/or that at least two deformation zones (15) are formed that are in contact with the same functional element (2) and are designed preferably diametrically around the depression and/or opening (8a, 8b) in the deformation element (1).

12. Method, as claimed in claim 11, characterized in that at least two segments (33) of the frame-shaped deformation zone (15) and/or the two deformation zones (15) and/or two deformation subzones have deformation resistances of different magnitudes, in particular, during heating and deforming.

13. Method, as claimed in claim 1, characterized in that the deformation zone (15) comprises a surface (17), wherein, in particular, the two segments (33) of the frame-shaped deformation zone (15) and/or the two deformation zones (15) and/or the two deformation subzones comprise surfaces (17) having a surface area of varying size.

14. Method, as claimed in claim 13, characterized in that the surface (17) of the deformation zone (15) is produced and/or enlarged by structuring the deformation element (1), in particular, by sawing and/or etching.

15. Method, as claimed in claim 11, characterized in that the surface area of the respective areas of the first (6) and/or second contact surface (7), which delimit the two segments of the frame-shaped deformation zone (15) and/or the two deformation zones (15) and/or the two deformation subzones, varies in size.

16. Method, as claimed in claim 11, characterized in that the outer edge (18) of the frame-shaped overlapping area (16a, 16b) of the first (6) and/or second contact surface (7) describes a first geometric figure; and the inner edge (19) describes a second geometric figure, wherein the first and the second geometric figures are each selected independently of one another from the group consisting of rectangle, trapezoid, in particular, isosceles or right-angled trapezoid, circle and triangle.

17. Method, as claimed in claim 1, characterized in that an area of the deformation element (1) is provided with a stabilization layer (20), which counteracts the deformation of the deformation zone (15).

18. Method, as claimed in claim 1, characterized in that the upper cooling temperature or the solidus temperature of the material of the functional element (2) is greater than the upper cooling temperature or the solidus temperature of the material of the deformation zone (15), wherein the temperature difference between the respective cooling temperature or solidus temperature of the material of the functional element (2) and the material of the deformation zone (15) is, in particular, greater than or equal to 100K.

19. Method, as claimed in claim 1, characterized in that during the process step of heat and deforming, at least one portion of the deformation zone (15), in particular, the entire deformation zone (15), is brought to a temperature that is above the upper cooling temperature or solidus temperature of the material of the deformation zone (15) and below the upper cooling temperature or solidus temperature of the material of the functional element (2).

20. Method, as claimed in claim 1, characterized in that the deformation of the deformation zone (15) is caused by a force introduced from the outside.

21. Method, as claimed in claim 1, characterized in that the carrier (5) has a supporting structure (21) that restricts one area of the functional element (2) and/or one area of the deformation element (1) in its deflectability and/or deformability in such a way that a tilting of the functional element (2) is supported.

22. Method, as claimed in claim 1, characterized in that at least one portion of the overlapping area of the first contact surface and one portion of the overlapping area of the second contact surface are retained during heating and deforming.

23. Method for producing optical components with the following process steps of:

providing a deformation element (1) and a carrier (5), bringing the deformation element (1) into contact with the carrier (5), as a result of which at least one first contact surface (6) is formed between the deformation element (1) and the carrier (5), applying a functional element (2) to the deformation element (1) in such a way that at least one second contact surface (7) is formed between the functional element (2) and the deformation element (1), said second contact surface overlapping at least partially the first contact surface (6), so that at least one deformation zone (15) is formed by means of the area of the deformation element (1) that is formed between the overlapping areas (16a, 16b) of the two contact surfaces (6, 7), heating and deforming at least one portion of the deformation zone (15) in such a way that the functional element (2) is at least partially deflected, in particular shifts and/or tilts, joining the functional element (2) with the deformation element (1) during the process step of applying the functional element (2) to the deformation element (1) and/or during the process step of heating and deforming the deformation zone (15), characterised in that the deformation element (1) is a structural element or a substrate or in that the deformation element (1) is fabricated from a substrate and in that the deformation zone (15) is designed so as to be frame-shaped and/or at least two deformation zones (15) are formed that are in contact with the same functional element (2), and/or in that the deformation zone (15) is arranged and/or formed in such a way that the largest deflection of the functional element (2) in the area of the second contact surface (7) takes place in an area which is in or near the overlapping area (16b) of the second contact surface (7).

* * * * *